United States Patent
Ohmi et al.

(10) Patent No.: US 6,726,814 B2
(45) Date of Patent: Apr. 27, 2004

(54) PROCESS FOR PRODUCING OPTICAL ARTICLE

(76) Inventors: Tadahiro Ohmi, 1-17-301, Komegafukuro 2-chome, Aoba-ku, Sendai-shi, Miyagi-ken (JP); Kazuyuki Harada, c/o Canon Kabushiki Kaisha, Kosugi-Jigyosho 53, Imaikami-cho, Nakahara-ku, Kawasaki-shi, Kanagawa-ken (JP); Nobuyoshi Tanaka, c/o Canon Kabushiki Kaisha 30-2, 3-chome, Shimomaruko, Ohta-ku, Tokyo (JP)

( * ) Notice: Subject to any disclaimer, the term of this patent is extended or adjusted under 35 U.S.C. 154(b) by 0 days.

(21) Appl. No.: 10/056,092

(22) Filed: Jan. 28, 2002

(65) Prior Publication Data

US 2002/0106830 A1 Aug. 8, 2002

Related U.S. Application Data

(62) Division of application No. 09/386,358, filed on Aug. 31, 1999, now Pat. No. 6,372,646, which is a division of application No. 08/598,807, filed on Feb. 9, 1996, now Pat. No. 5,981,075.

(30) Foreign Application Priority Data

Feb. 13, 1995 (JP) ............................... 7-24444

(51) Int. Cl.$^7$ .................... C23C 14/34; B05D 5/06; B05D 1/36; B05D 7/00
(52) U.S. Cl. .................... 204/192.26; 204/192.12; 204/192.27; 204/192.28; 427/162; 427/422; 427/419.2; 427/419.3
(58) Field of Search ............. 204/192.12, 192.26, 204/192.27, 192.28; 427/162, 402, 419.2, 419.3

(56) References Cited

U.S. PATENT DOCUMENTS

| | | | |
|---|---|---|---|
| 3,907,660 A | 9/1975 | Gillery | 204/298 |
| 4,125,446 A | 11/1978 | Hartsough et al. | 204/192 |
| 4,172,020 A | 10/1979 | Tisone et al. | 204/192 |
| 4,196,246 A | 4/1980 | Takayama et al. | 428/213 |
| 4,284,323 A | 8/1981 | Jankowitz | 350/1.6 |
| 4,333,983 A | 6/1982 | Allen | 428/336 |
| 4,533,449 A | 8/1985 | Levenstein | 204/192 |
| 4,805,989 A | 2/1989 | Nakajima | 350/164 |
| 4,824,546 A | 4/1989 | Ohmi | 204/298 |
| 4,849,081 A | 7/1989 | Ross | 204/192 |
| 4,947,047 A | 8/1990 | Muraki | 250/492.2 |
| 5,221,636 A | 6/1993 | Landreau et al. | 437/129 |
| 5,381,210 A | 1/1995 | Hagiwara | 355/53 |
| 5,399,435 A | 3/1995 | Ando et al. | 428/428 |
| 5,408,489 A | 4/1995 | Kügler et al. | 372/57 |
| 5,455,144 A | 10/1995 | Okamoto et al. | 430/313 |
| 5,457,570 A | 10/1995 | Lu et al. | 359/361 |
| 5,494,743 A | 2/1996 | Woodard et al. | 428/336 |
| 5,605,776 A | 2/1997 | Isao et al. | 430/5 |
| 5,661,596 A | 8/1997 | Biro et al. | 359/359 |
| 5,783,049 A * | 7/1998 | Bright et al. | 204/192.14 |
| 5,911,856 A | 6/1999 | Suzuki et al. | 204/192.13 |

FOREIGN PATENT DOCUMENTS

| | | |
|---|---|---|
| JP | 61-077002 | 4/1986 |
| JP | 63-113501 | 5/1988 |
| JP | 63-113502 | 5/1988 |

OTHER PUBLICATIONS

Nakamura, et al., Extended Abstracts, 180th Electrochemical Society Meeting, Phoenix, Abstract No. 534, pp. 798–799, Oct. 1991.
Pitt, et al., "Automatic Monitoring of Deposition Conditions During rf Sputtering of Dielectric Materials," Vacuum, vol. 25, No. 6, Pergamon Press Ltd. (Jun. 1975).
Ohmi, et al., Extended Abstracts, 174th Electrochemical Society, Fall Meeting, Abstract No. 396, pp. 579–580, Oct. 1988.
Oblas, William W., et al., "Argon Concentration in Tungsten Films Deposited by DC Sputtering," *J. Vac. Sci. Technol.* (1970), 7(1) (Jan/Feb), pp. 129–134 (Abstract only).
Temple, P.A., et al., "Optical Properties of Mirrors Prepared by Ultraclean DC Sputter Deposition," *Natl. Bur. Stand.* (U.S.), Spec. Publ. (1976), 462, pp. 194–202 (Abstract only).

* cited by examiner

Primary Examiner—Steven H. VerSteeg

(57) ABSTRACT

A process for producing an optical article includes laminating a first optically transparent thin layer and a second optically transparent thin layer having a higher refractive index than that of the first optically transparent thin layer on a surface of a substrate. At least one of the first and second optically transparent thin layers is deposited by sputtering using a sputtering gas comprising atoms of at least one selected from the group consisting of krypton, xenon and radon.

37 Claims, 14 Drawing Sheets

PROCESS FOR PRODUCING OPTICAL ARTICLE

This application is a divisional of U.S. patent application Ser. No. 09/386,538, filed Aug. 31, 1999, now U.S. Pat. No. 6,372,646, issued on Apr. 16, 2002, which is a divisional of U.S. patent application Ser. No. 08/598,807, filed Feb. 9, 1996, now U.S. Pat. No. 5,981,075, issued on Nov. 9, 1999.

BACKGROUND OF THE INVENTION

1. Field of the Invention

The present invention concerns an optical article such as a lens or a mirror, an exposure apparatus or optical system such as a stepper having it, and a process for producing the optical article. More particularly, the invention relates to an optical thin film for an optical article suitably applicable to an exposure apparatus or optical system using an excimer laser, and a process for producing it.

2. Related Background Art

Optical articles, including lenses, mirrors, and optical filters, are used, for example, in optical apparatus such as cameras, telescopes, and microscopes. These optical articles have an antireflection film or a reflection-enhanced film on the surface therefore for prevention of reflection or for enhancement of reflection.

An exposure apparatus is a kind of an optical apparatus equipped with such an optical article. The exposure apparatus is used in the fabrication steps of semiconductor integrated circuits or photomasks for fabricating them. A typical example of an exposure apparatus in this field is an exposure apparatus called a stepper.

An illumination light source in such an exposure apparatus, conventionally used, was a super-high pressure mercury lamp, a xenon-mercury arc lamp, or the like for emitting the g-line (435.8 nm), the h-line (404.7 nm), and the i-line (365 nm). However, an attempt has recently been made to use lasers emitting far-ultraviolet rays (200 to 260 nm) or emitting a beam of high power and narrow spectral width in order to realize high exposure processing capability per unit time (throughput) and uniform illumination characteristics on an exposed body such as a wafer. Among others, an excimer laser is one of desirable light sources, because it emits light in a very narrow spectral width and at high output power.

One of known optical articles for an excimer laser is the one having an antireflection film deposited by vacuum vapor deposition as disclosed in Japanese Laid-open Patent Application No. 63-113501 or Japanese Laid-open Patent Application No. 63-113502.

However, for example, if a lens having sufficient optical characteristics in the optical system for visible light was used in an optical system for an excimer laser, it was sometimes difficult to maintain optical characteristics sufficient to be applied to practical use. Specifically speaking, transmission characteristics, particularly, of the optical thin film provided over the surface of a lens or mirror were not sufficient to make the best use of the advantages of the excimer laser, and there was a problem in the durability thereof.

In addition, since the optical articles for an exposure apparatus were required to have a surface formed at very high accuracy, strict control of temperature conditions was necessary in forming the optical thin film. Thus, film forming techniques generally regarded as being preferable were not able to be used as they were in fabricating such optical articles.

As explained above, in order to fabricate an optical article that is durable against the use of an excimer laser, the optical article must be designed based on a novel idea and a novel approach.

SUMMARY OF THE INVENTION

The present invention has been accomplished in view of the technical problems discussed above, and an object of the invention is to provide an optical article having optical characteristics fully durable against such hard operation conditions as in applications with an excimer laser.

Another object of the present invention is to provide an optical article with an optical thin film having little unnecessary light absorption and having uniform physical properties over a large area.

Still another object of the present invention is to provide an optical article with an optical thin film which can be formed at low temperature and which is free from the negative effect of stress such as film separation.

A further object of the present invention is to provide an optical system and an exposure apparatus having the above optical article excellent in characteristics.

Of course, the one durable to the excimer laser must exhibit adequately good characteristics also in optical systems using the other light.

The optical article of the present invention is an optical article in which an optical thin film is laminated on a surface of a substrate, wherein the optical thin film comprises atoms of at least one selected from the group consisting of krypton, xenon, and radon.

The optical article of the present invention is an optical article in which an antireflection film comprising a first optically transparent thin layer and a second optically transparent thin layer having a higher refractive index than that of the first optically transparent thin layer are formed on a surface of an optically transparent substrate, wherein at least either one of the first and second optically transparent thin layers comprises atoms of at least one selected from the group consisting of krypton, xenon, and radon.

Further, the optical article of the present invention is an optical article in which a reflection-enhanced film comprising a first optically transparent thin layer and a second optically transparent thin layer having a lower refractive index than that of the first optically transparent thin layer are formed on a surface of a substrate, wherein at least either one of the first and second optically transparent thin layers comprises atoms of at least one selected from the group consisting of krypton, xenon, and radon.

The optical article of the present invention may be adaptive to the arrangement further having a third optically transparent thin layer having a different refractive index from those of the first and second optically transparent thin layers. The first optically transparent thin layer is preferably silicon oxide, and the second optically transparent thin layer is preferably aluminum oxide or tantalum oxide. The content of the atoms of the selected element in the optically transparent thin layer is not more than 5 atomic %, and the contents of the element in the first and second optically transparent thin layers are different from each other. The article is characterized in that the substrate comprises silica or fluorite. Further, the optical article of the present invention is characterized in that it selectively transmits or reflects the excimer laser light.

The exposure apparatus of the present invention is an exposure apparatus having an illumination light source and a stage for an exposed object to be mounted thereon in which an illumination optical system and/or a projection optical system comprises a plurality of optical articles in each of which a first optically transparent thin layer and a second optically transparent thin layer having a higher refractive index than that of the first optically transparent thin layer are laminated on a surface of a substrate, wherein at least either one of the first and second optically transparent thin layers comprises atoms of at least one selected from the group consisting of krypton, xenon, and radon. The apparatus is characterized in that the illumination light source is an excimer laser light source. Further, the apparatus is characterized in that the optical article has a characteristic to selectively transmit a plurality of laser light beams of different wavelengths from each other.

The process for producing the optical article of the present invention is a process for producing an optical article in which a first optically transparent thin layer and a second optically transparent thin layer having a higher refractive index than that of the first optically transparent thin layer are laminated on a surface of a substrate, wherein at least either one of the first and second optically transparent thin layers is deposited by sputtering using a sputtering gas comprising atoms of at least one selected from the group consisting of krypton, xenon, and radon. The process is characterized in that a gas for oxidation is used as a reaction gas in addition to the sputtering gas. Further, it is preferred that the substrate be held at 100° C. or less in the sputtering and that before the sputtering at least a film-forming surface of the substrate be held at 100° C. or less under a nitrogen gas atmosphere.

The present inventors have accomplished the present invention by finding out that, as compared with films not containing krypton, xenon, or radon, obtained by vacuum vapor deposition or sputtering with Ar gas, films containing atoms of at least one of these three elements can maintain good transmittances for a longer period.

The invention can provide an optical article having an optical thin film which is less in unnecessary light absorption, uniform over a large area, free of film separation, and excellent in durability.

The invention can provide an optical article having excellent transmission characteristics of light used, because the optical thin film is used as an antireflection film.

The invention can provide an optical article having excellent reflection characteristics of light used, because the optical thin film is used as a reflection-enhanced film.

The invention can achieve an optical article having better transmittance stability, and particularly having excellent applicability to the excimer laser optical system.

The invention can achieve an optical article having better transmittance stability, and particularly having excellent applicability to the i-line optical system.

The invention makes a non-monocrystalline film finer and reduces degradation of transmission characteristics more by the feature that the content of xenon, krypton, or radon is not more than 5 atomic %.

The invention improves adhesion and enhances the antireflection or reflection-enhancing effect.

The invention can provide an excellent excimer laser optical system.

The invention can provide an excellent excimer laser reflection optical system.

The invention hardly causes an error in exposure parameters, and it enables good photolithography and enhances reliability.

The invention enables high-definition and high-accuracy photolithography.

The invention enables automatic alignment with high accuracy and high reliability.

The invention enables formation of uniform plasma, whereby an optical article with uniform characteristics and in a large area can readily be produced at the low temperature of not more than 150° C., preferably not more than 100° C.

The invention has the feature that the gas having the oxidation effect is introduced as a reaction gas, which provides the ability to obtain an oxide film with excellent characteristics in a stoichiometric composition or in a composition very approximate thereto, even though it is a non-monocrystalline film.

The invention can suppress a change of the surface shape of the optical article. Further, gas emission becomes less during formation of a film, which can suppress occurrence of film separation or unnecessary products.

The invention can suppress a gas emission during formation of a film by exposing the substrate to the nitrogen gas atmosphere before sputtering.

The invention can provide an optical system having excellent transmission characteristics of light used.

The invention can provide an optical system excellent in reflection characteristics of light used.

DETAILED DESCRIPTION OF THE PREFERRED EMBODIMENTS

The embodiments of the present invention will be explained with reference to the drawings. It should be noted that the present invention is by no means limited to these embodiments, but the present invention may have various modifications and arrangements including replacement of constituent elements into substitutes or equivalents or a change of materials employed, as long as the object of the present invention can be achieved.

(Optical Articles in which the Optical Thin Film is Laminated on the Surface of a Substrate.)

FIGS. 1A–1F are diagrammatic cross sections of optical articles having various optical thin films according to an embodiment of the present invention.

Figure 1A:
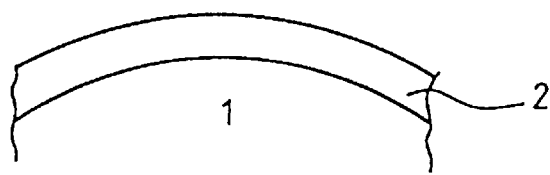
FIGS. 1A to 1F are diagrammatic, sectional views of optical articles, each having an optical thin film.

FIG. 1A shows a transmission type optical article in which an antireflection film 2 is formed on the surface of a transparent substrate 1, which is used as a lens or a light transmitting window.

Figure 1B:
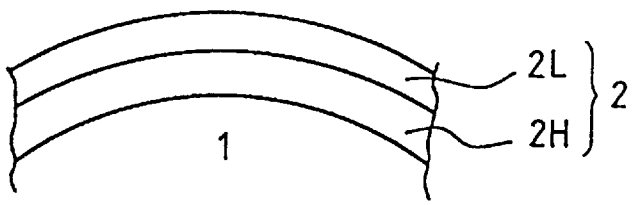

The antireflection film 2 may be a single thin layer film or a laminate structure of optically transparent thin layers having mutually different refractive indices as shown in FIG. 1B. Here, the thin film 2H is a high-index thin layer and the thin film 2L is a low-index thin layer. The low-index thin layer is disposed on the surface (air) side, thereby giving the antireflection effect.

Figure 1C:
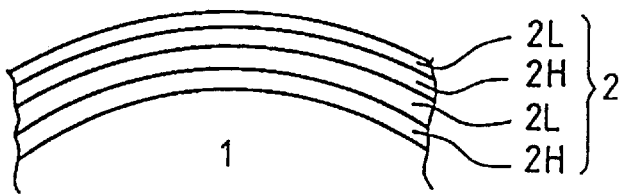

FIG. 1C shows a structure in which two optically transparent thin layers with mutually different refractive indices are alternately laminated two layers each (four layers in total).

Figure 1D:
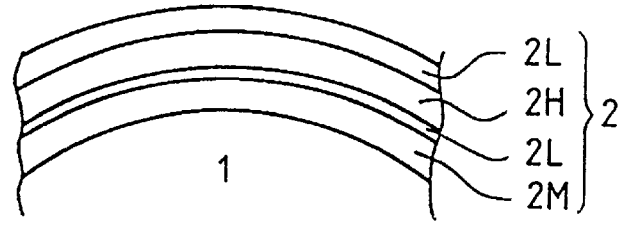

FIG. 1D shows a structure having three types of optically transparent thin layers with mutually different refractive indices and one low-index thin layer. This example employs the high-index thin layer 2H, the low-index thin layer 2L, and the thin layer 2M having an intermediate refractive index between them.

Figure 1E:
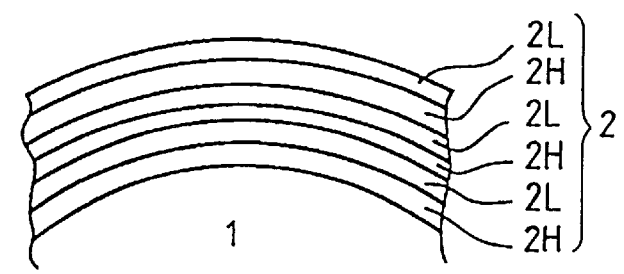

FIG. 1E shows a structure in which two optically transparent thin layers with mutually different refractive indices are alternately laminated three layers each (six layers in total).

Figure 1F:
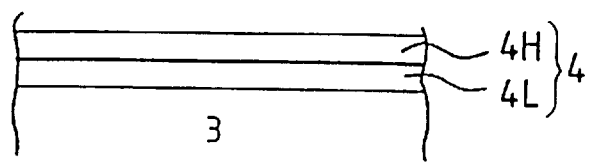

FIG. 1F shows an optical article having a reflection-enhanced film 4 on either an optically transparent or a non-transparent substrate 3, and the reflection-enhanced film 4 is formed in a laminate structure of optically transparent thin layers with mutually different refractive indices. In this example reflection is enhanced by placing the high-index thin layer 4H on the surface side. Symbol 4L represents the low-index thin layer. Although not shown, the reflection-enhanced film 4 may be a laminate structure of repetitive multiple layers (for example, 10 to 100 layers) of the thin layer 4L and thin layer 4H.

Materials for the substrate 1, 3 and for the thin layers are properly selected depending upon the wavelength of light used and the structure of the optical thin film. The same can be applied to the thickness of substrate 1, 3 and the thicknesses of the respective thin layers. The thickness of each thin layer is selected in the range of about 0.1 nm to 1 µm.

(Substrate)

A material for the substrate un the present invention may be an optically transparent substrate, for example, such as fused silica ($SiO_2$) or fluorite ($CaF_2$). The material may contain a small amount of an adjusting material for adaptation for the light used. Specifically, the material may contain $B_2O_3$, $Na_2O$, $K_2O$, PbO, or $Al_2O_3$ in addition to the main ingredient of $SiO_2$. The substrate 3 for the reflection-enhanced film such as a mirror may be a substrate formed by putting a high reflection metal film on the optically transparent surface as described above, or a metal.

Materials for the optically transparent thin layers for constituting the optical thin film in the present invention are properly selected from the same group including the following materials either in the case of the antireflection film 2 or in the case of the reflection-enhanced film 4. The materials included in the group are, for example, non-monocrystalline oxides including silicon oxide (1.44), tantalum oxide (2.17), aluminum oxide (1.72), zirconium oxide (2.25), hafnium oxide (2.25), yttrium oxide (2.10), and scandium oxide (2.11), and non-monocrystalline fluorides including magnesium fluoride (1.43), neodymium fluoride (1.66), calcium fluoride (1.46), lithium fluoride (1.37), sodium aluminum fluoride (1.35), thorium fluoride (1.59), and lanthanum fluoride (1.59). The numerals in the parentheses are examples of refractive indices at the light having a wavelength of 248 nm corresponding to the KrF excimer laser.

(Atoms which the Optical Thin Film Contains)

The atoms which the optical thin film in the present invention contains were found out through many repetitive experiments by the inventors.

If an optical article used in the excimer laser optical system should have even a little quantity of absorption of laser light, heat would be generated because of its high power and the heat would be accumulated while used. It was found that the heat could degrade the surface property of the optical article and could degrade the optical transparency of the optical thin film.

The inventors found that when the optical thin film contained the atoms in the present invention as a countermeasure, light absorption of the optical thin film became nearly zero. When a lot of lenses were combined to form an optical system, it became possible to make even overall light absorption almost zero. Use of such an optical article remarkably improved reliability of the exposure apparatus.

The optical thin film used in the present invention is a non-monocrystalline thin film containing atoms of at least one selected from the group consisting of xenon (Xe), krypton (Kr), and radon (Rn). When the optical thin film is constructed of many thin layers, a necessary condition is that at least one thin layer out of them contains the above atoms. Among others, the effect is remarkable when the thin film is made of an oxide. When the thin film contains the above atoms in the content not exceeding 5 atomic %, packing of the amorphous film is improved to achieve excellent durability. More preferably, the content is not more than 3 atomic %, and most preferably, not more than 1 atomic %. The optimum minimum value of the content is 0.5 atomic ppm. In the case where the optical thin film is made of a lot of thin layers, a preferred arrangement is such that contents of the above atoms in the respective films are made different from each other, which enhances adhesion to each other. If the film contains two or more out of the above three elements, the total content is to be controlled below 10 atomic %, whereby packing of the amorphous film can be improved so as to achieve excellent durability. The contents of these elements can be measured by the Rutherford backscattering analysis (RBS), the secondary ion mass spectrometry (SIMS), or the total reflection fluorescence X-ray diffractometry.

Further, if the thin layer contains the above three elements, it is more preferred in order to obtain a good-quality film that the content of argon (Ar), helium (He), or neon (Ne) be controlled to be not more than 0.1 atomic %.

(Light used in the Optical System to which the Optical Article is Applied)

The light used in the optical system to which the optical article of the present invention is applied is ultraviolet light such as the i-line, far-ultraviolet light, or laser light. Lasers for emitting such light are, for example, a He—Cd laser (442 nm), an Ar$^+$ laser (488 nm, 515 nm), a He—Ne laser (554 nm, 633 nm), and a semiconductor laser (780 nm).

Particularly, the optical article of the present invention is suitable for optical systems of the i-line or excimer lasers, and among others, it is most suitable for excimer laser optical systems. Excimer lasers include, for example, those of $F_2$ (157 nm), ArF (193 nm), KrCl (222 nm), KrF (248 nm), ClF (284 nm), XeCl (308 nm), $I_2$ (342 nm), and XeF (351 nm, 353 nm). Among them, the KrF excimer laser, XeCl laser, or ArF excimer laser may be suitably applicable to the exposure apparatus.

More desirably, the optical article also has good transmission characteristics for light of a relatively long wavelength such as a He—Ne laser for alignment in addition to the above excimer lasers for exposure. Such an optical article can be applied to the exposure apparatus employing the TTL (Through The Lens) alignment method by which high-accuracy alignment can be made by letting alignment light pass through a projection optical system. Thus, the range of applications can be further widened, which is more preferable.

(Production Method and Producing Apparatus)

Below described are the production process and producing apparatus for producing the optical thin film containing the atoms of at least one selected from the group consisting of xenon (Xe), krypton (Kr), and radon (Rn).

The production process of the optical thin film used in the present invention may be chemical vapor deposition (CVD) or physical vapor deposition (PVD) using the above rare gas. From the finding of the inventors, it is desired to deposit at least one of the thin layers forming the optical thin film by sputtering with a sputtering gas containing atoms of at least one selected from the group consisting of krypton, xenon, and radon.

Figure 2:
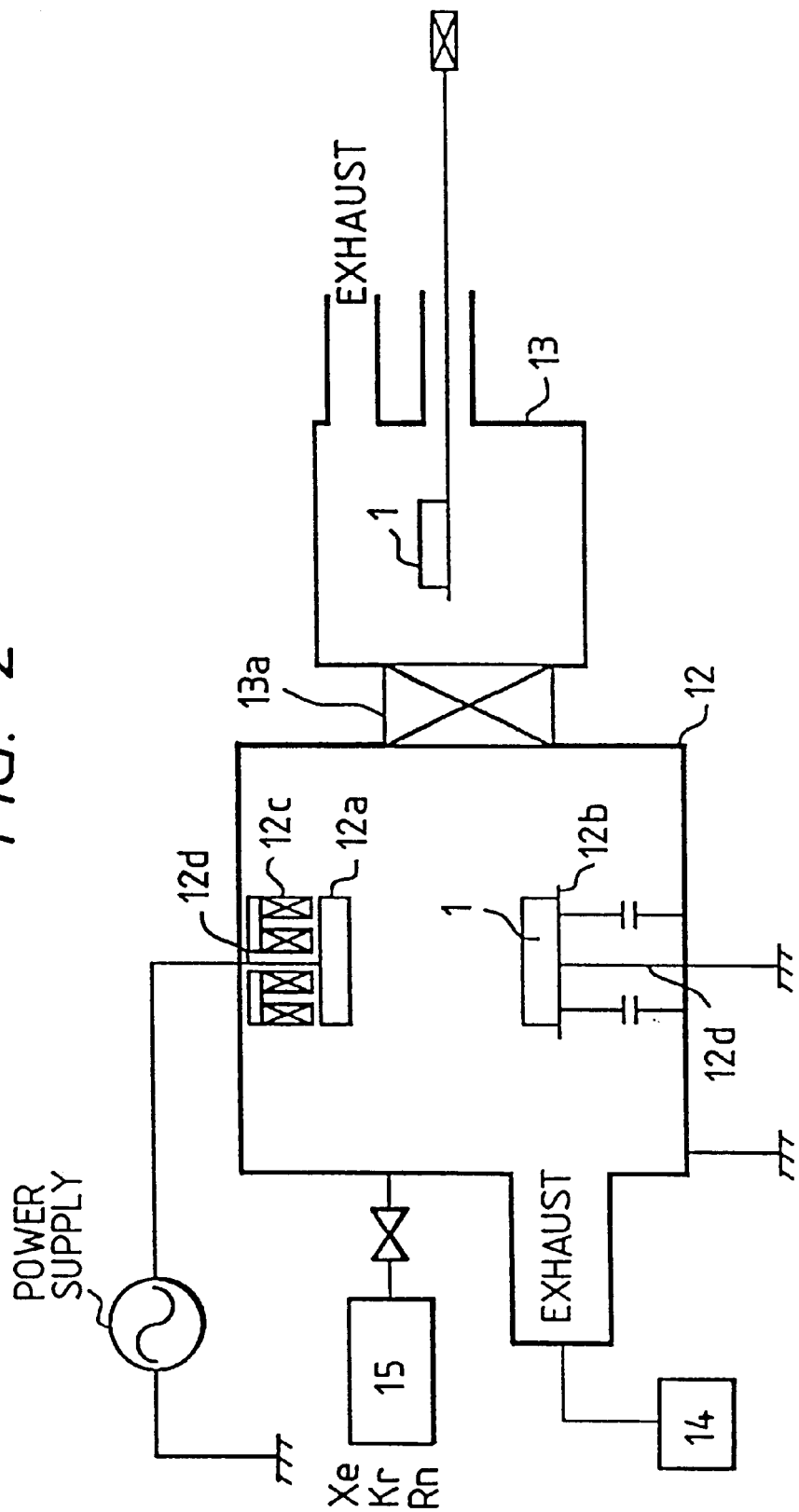
FIG. 2 is a diagrammatic drawing to show a basic setup of a producing apparatus used for forming the optical thin film of the present invention.

FIG. 2 is a diagrammatic drawing to show a basic layout of the producing apparatus of the optical thin film used in the present invention. The producing apparatus has a film-forming chamber 12 in which sputtering is carried out, a load-lock chamber 13 which is provided if necessary and which is a preparation chamber for a film-forming substrate 1 to be carried into or out of the chamber 12 and for the substrate 1 to be kept in, an exhaust means 14, and a gas supply means 15. Inside the film-forming chamber 12 there are a target 12a, a substrate holder 12b, a magnet 12c, and electrodes 12d disposed, and the electrode 12d is connected to a high-frequency power supply. A gate valve 13a is set between the load-lock chamber 13 and the film-forming chamber 12 to separate atmospheres of these two chambers from each other.

The exhaust means 14 is at least one properly selected from various pumps including a turbo molecular pump, a cryo-pump, a mechanical booster pump, and an oil diffusion pump, as installed together with a valve and pipes.

The gas supply means is composed of a gas container for storing either krypton, xenon, or radon, a valve, a gas flow controller, and pipes. Of course, the apparatus may be arranged to supply in oxidizing gas such as oxygen if necessary.

Production procedures are as follows. A substrate set in the load-lock chamber 13 is carried into the chamber 12 by opening the gate valve 13a and is set on the holder 12b in the chamber 12. The substrate may be heated in a temperature range not exceeding 100° C. under a nitrogen atmosphere with necessity in load-lock chamber 13.

Then, the gate valve 13a is closed and the chamber 12 is evacuated. After that, krypton or xenon is supplied as a gas for sputtering. Of course, a reaction gas such as oxygen is further supplied if reactive sputtering is carried out. Power of radio frequency is supplied to the electrode 12d to generate glow discharge plasma of the above rare gas. In this arrangement, the constituent atoms of the target 12a are beaten and driven out therefrom by the rare gas, thereby depositing over the substrate surface. In order to avoid a change of the surface shape on this occasion, it is desired to control the substrate temperature so as not to exceed 100° C. due to the plasma by providing the holder 12b with a heating and cooling means and a temperature sensor. Such a controller may be omitted, of course, if the temperature does not exceed 100° C. even without cooling.

If the optical thin film is made of two or more types of thin layers, the above steps are repeated as changing the target materials. An arrangement for improving the throughput is such that a plurality of targets are disposed in one chamber and a target to be exposed to the plasma is selected. Another arrangement may be such that a plurality of film-forming chambers are prepared independently of each other and each chamber is dedicated for film formation of one thin layer.

In order to control an amount of krypton, xenon, or radon contained in the thin layer, attention must be paid to keep the content not more than 5 atomic % by controlling a supply amount of gas, the temperature of the substrate, and the pressure upon formation of a film. A method for forming the thin film of oxide may be reactive sputtering using a target of a pure metal such as aluminum or tantalum and oxygen as a reaction gas, or simple sputtering with an oxide target. A preferred process is reactive sputtering which is carried out with a target of an oxide as supplying oxygen gas together with the above rare gas.

Figure 3:
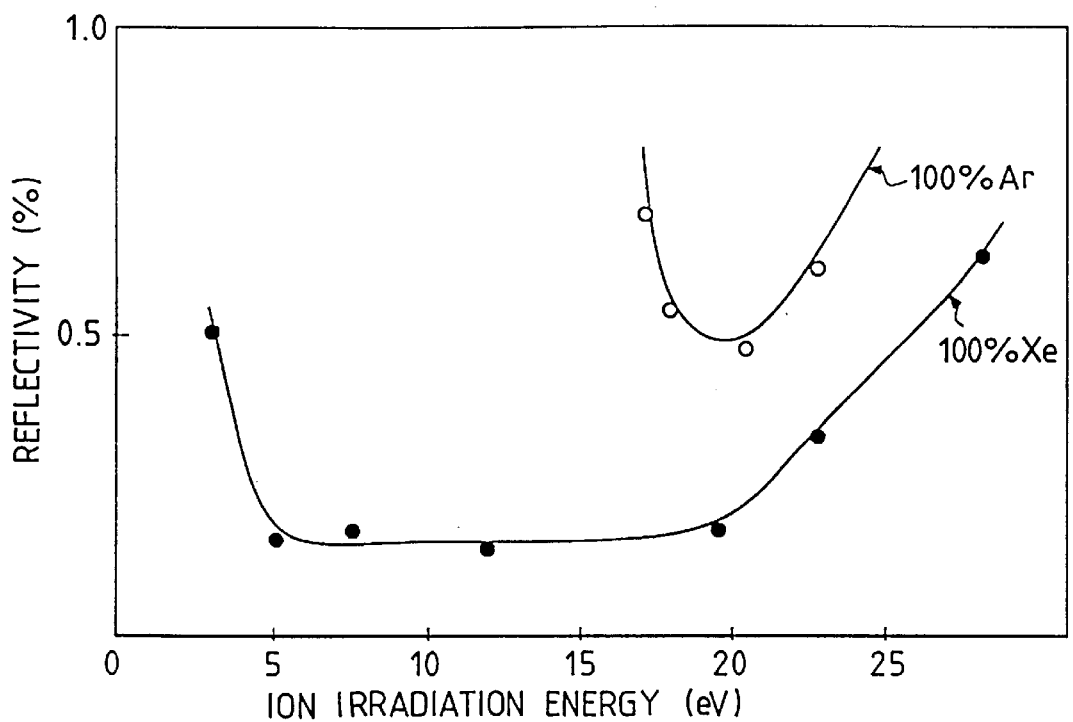
FIG. 3 is an example of a graph to show changes of reflectivity against ion irradiation energy in the present invention.

Sputtering using the above rare gas can generate a large plasma region having a uniform energy distribution and also improve an energy dependence of film quality. FIG. 3 is an example of a graph to show changes of reflectivity against ion irradiation energy, which confirms that the thin film exhibits excellent transmittances (low reflectivities) in a wide region of energy. It is seen that the film from 100% argon can exhibit good transmittances only in a very limited range. This result means that reproducibility of film formation is good and adjusting ranges of parameters upon film formation become wide, thus facilitating film formation.

Conditions employed in the sputtering of the present invention are as follows.

The pressure during sputtering may be one that can stably maintain discharge, specifically between 1 and 5 mTorr.

A value of the RF power may be selected so as not to damage the thin layer and so as to be capable of removing adsorbed impurities, specifically between 5 W and 50 W. From the same reason, an appropriate time is between 1 minute and 20 minutes.

The rare gas for sputtering may be not only one of Kr, Xe, and Rn atoms, but also a mixture gas thereof or a mixture gas with Ar, He, or Ne. Any volume ratio may be applied in the case of the mixture gas of Kr, Xe, and Rn, but a preferred example is a volume ratio of Xe:Kr=1:1. When mixed with Ar, He, or Ne, these atoms had better be controlled in an amount less than the gas of Kr, Xe, or Rn in order to prevent excessive atoms from being taken into the thin layer.

As the frequency of applied power becomes lower, a self bias of the target becomes greater in the negative region. In that case, the sputter rate increases, but, on the other hand, variations appear in irradiation energy. Thus, an appropriate range is between 10 MHz and 500 MHz.

According to another experiment of the inventors, when a non-transparent film of silicon (Si) or aluminum (Al) was formed by sputtering and when sputtering was carried out using Xe, no content of Xe was recognized in a Si film or Al film deposited. This is in contrast with the fact that Ar is readily taken into the film in sputtering with Ar.

Accordingly, in order to form the optical thin film in which the atoms of Xe, Kr, or Rn are contained in the range of not more than 5 atomic % using the sputtering process of the present invention, preferred conditions are such that the substrate temperature is set at a relatively low temperature, the frequency of power for generating the plasma is set relatively low, and deposition is effected at a relatively slow deposition rate under a mixture atmosphere with oxygen gas. Specific setting values will be described later. This permits a fine amount of Xe, Kr, or Rn to be taken into the transparent optical thin film.

A mixture of oxygen in these gases is preferred even in formation of metal oxide. This has an effect to restore the metal oxide damaged, by oxidizing bonds at broken bonding for the metal oxide from the target. A preferred rate of oxygen is not more than 20 volume % to the rare gas. Too much oxygen makes the film-forming rate extremely lower and decreases the effect of surface activity by the rare gas ions, which does not permit a fine film to be formed. In the case where the target is a metal and a film of a metal oxide is formed, an amount of oxygen to the rare gas becomes greater than in the case of the metal oxide target. However, the method using the target of a high-purity metal oxide and partially reinforcing weak portions by oxidation is more preferred rather than the method for forming the metal oxide by oxidizing a metal on a lens, and can form a fine film with little damage.

Next described is another example of the producing apparatus of the optical thin film used in the present invention.

This apparatus is a sputtering apparatus capable of supplying deposit atoms as controlling energy of ions impinging on the lens surface.

Figure 6:
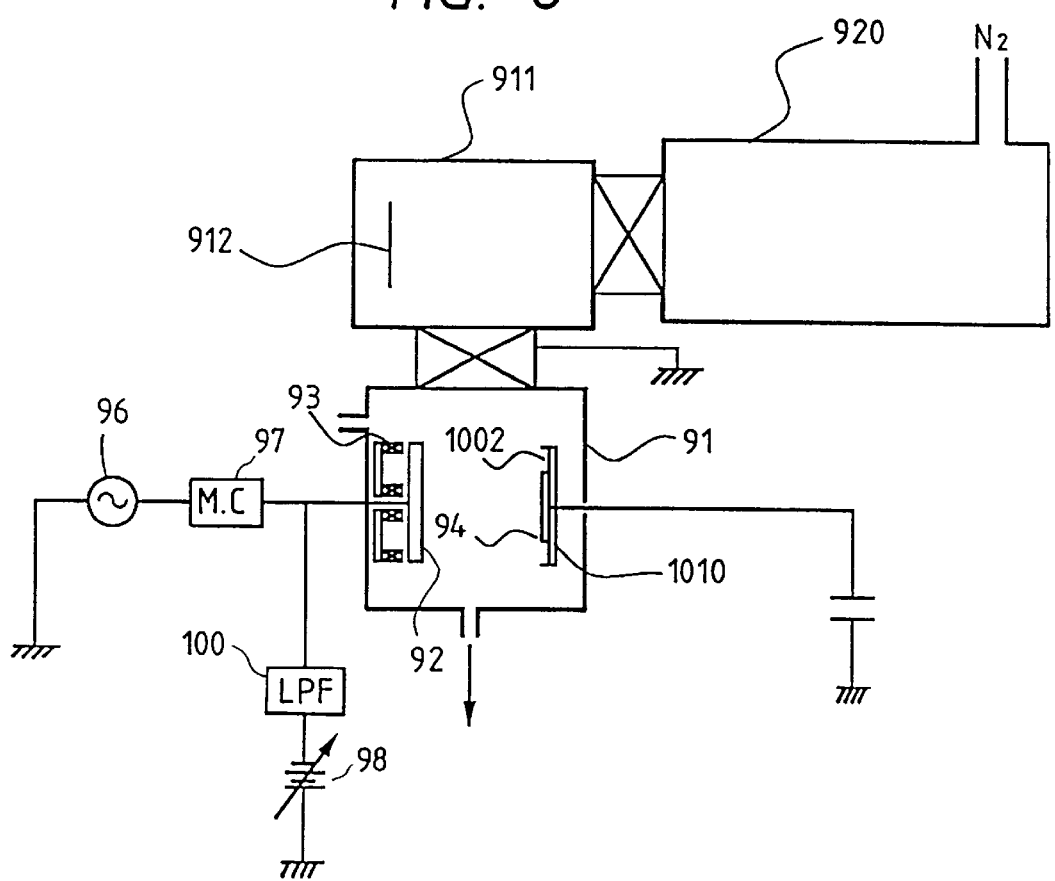
FIG. 6 is a schematic drawing of a sputtering apparatus in Example 1.

The apparatus of FIG. 6 is an rf-dc combination type bias sputtering apparatus. In FIG. 6, numerals 91, 911 designate vacuum chambers, wherein 911 is a load-lock chamber.

Numeral 920 is a lens stockers which is connected to the load-lock chamber and in which clean $N_2$ always flows. Numeral 912 denotes a halogen lamp, which enables preheating in the load-lock chamber 911. Numeral 912 denotes a target, 93 a magnet for generating the plasma with good efficiency, and 94 a convex lens mounted on a lens support member 1002 by a lens stopper, and this lens support member is mounted on a lens holder 1010. This lens holder has a rotating system. Numeral 96 presents a high-frequency power supply arranged capable of changing the frequency, 97 a matching circuit, 98 a DC power supply for determining the DC potential of the target, and 100 a low-pass filter of the target. Although not shown, a second high-frequency power supply may be provided on the lens side to control the energy or the like of ions impinging on the lens with better accuracy. In this example, the lens holder 1010 is made of SUS 316, and the potential is the floating potential.

The vacuum chambers 91, 911, 920 are made of a material with less gas emission, for example, of SUS 316. The inside surfaces of the chambers are surfaces subjected to electropolishing or electro-chemical buffing as a surface treatment and micro-finished to a surface smoothness of Rmax<0.1 µm, and a passivation oxide film is formed with high-purity oxygen on each surface (T. Ohmi et al., Extended Abstracts, 174th Electrochemical Society, Fall Meeting, 296, 579–580, October. 1988). Thus, the surfaces have a structure resistant to absorption of gas and avoiding pollution with an impurity as much as possible.

The entire gas supply system, including the mass flow controller and filter, is made of SUS 316, Which is subjected to electropolishing and passivation oxidation so as to keep an amount of impurities upon introducing the gas in the process into the chamber as small as possible. The exhaust system is constructed as follows. A main pump is a magnetic levitation type and tandem type turbo molecular pump, and a dry pump is used as an auxiliary pump. This exhaust system is an oil free system, which is so constructed as to be little polluted with impurities. The second-stage turbo molecular pump is a large-flow type pump, which can maintain the exhaust rate even for a vacuum degree of mTorr order during generation of plasma. The lens 94 is introduced into the vacuum chamber 91 through the load-lock chamber arranged next to the chamber 91, thereby preventing impurities from intruding into the vacuum chamber 91.

As a result, an amount of impurities upon introduction of a lens into the chamber is small; even water mixed in a largest amount is not more than some ppb. The background vacuum degree of the vacuum chamber is $10^{-8}$ or less. Since the target is equipped with a variable high-frequency power supply variable up to some hundred MHz, the plasma can be generated in a high density, and the self bias and the plasma potential can be changed. The apparatus is also arranged in such a manner that the DC power supply for applying a DC potential is connected through the low-pass filter to the target and that in the case of a conductive target, the potential of the target can be controlled also by the DC power supply. This arrangement makes it possible to control the film-forming conditions, including:

(a) the film-forming rate, (b) the energy of ions impinging on the substrate, (c) the plasma density.

Figure 7:
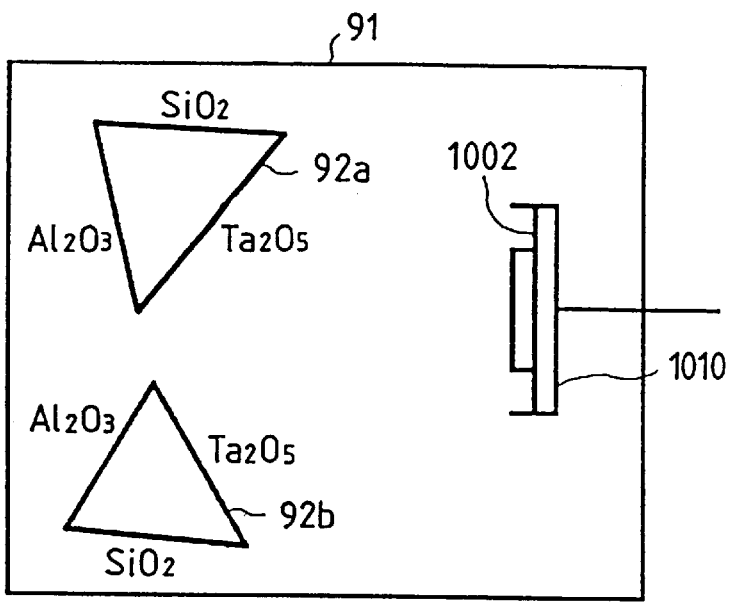
FIG. 7 is a diagrammatic drawing to show a chamber of another producing apparatus used for forming the optical thin film of the present invention.

FIG. 7 is a drawing to show a chamber of another sputtering apparatus used in the present invention.

In this chamber 91 there are two triangular-prism target holders. This arrangement of the target holders is a different point from the apparatus shown in FIG. 6, and the other arrangement is the same as that of the apparatus of FIG. 6.

In this target arrangement, sputtering can be carried out by selecting one of three types of targets by rotating the holders 92a, 92b.

The example of FIG. 7 illustrates a case using the targets of tantalum oxide, aluminum oxide, and silicon oxide.

During sputtering, angles of rotation of the holders are adjusted so that the surfaces of the targets may become inclined relative to the surface of the substrate. This arrangement facilitates formation of a uniform film on the substrate having any surface shape and size, for example, on a concave lens, a convex lens, and a concave mirror.

Figure 8:
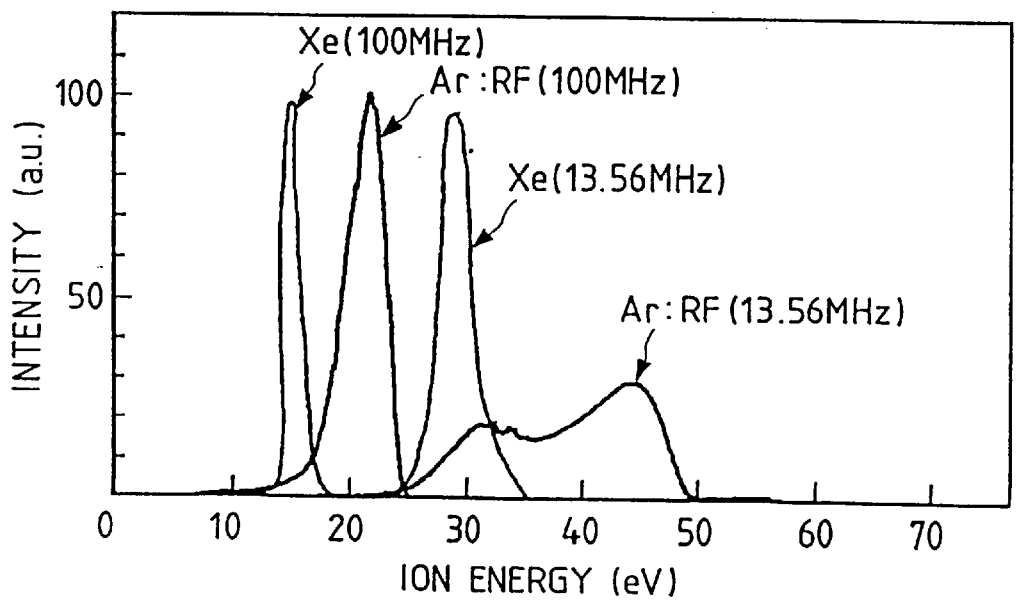
FIG. 8 is a graph to show energy distributions of ions impinging on a substrate surface earthed, against frequency of high-frequency power supplied to a target.

FIG. 8 is graph to show energy distributions of ions impinging upon the substrate surface earthed, against frequency of the high-frequency power supplied to the target. This figure shows cases where the pressure is 7 mTorr and Ar ions and Xe ions are used, and shows that as the frequency increases, the energy distribution becomes sharper and that two peaks appearing in the case of low frequency change into a distribution having one energy peak. This is because with an increase of the frequency the ions become unlikely to be vibrated by the high-frequency waves, namely, because they come to have a stabler plasma potential. The frequency is preferably as high as possible in view of controllability, but too high a frequency would be a cause to produce an in-plane distribution because the wavelength becomes comparable to the substrate.

As for ion species, heavier atoms are more preferable in order to obtain a further stabler plasma potential, because heavier atoms are less vibrated by high-frequency waves; the energy distribution becomes smaller with an increase of weight of atoms, specifically, in the order of Kr, Ne, and Rn, achieving a good in-plane distribution of characteristics of the film. An optimum use range of frequency differs depending upon the atoms used, but a preferred range is approximately 10 to 500 MHz in the use of Kr, Xe, or Rn. As for the energy supply to the surface of a deposit film by ion irradiation, as comparing ions with the same energy, heavier atoms can give energy with efficiency only to the vicinity of the surface. In addition, heavier atoms decrease chances to intrude into the film deeply to damage it. Accordingly, there are effects to form a fine film and to improve surface flatness.

Figure 9:
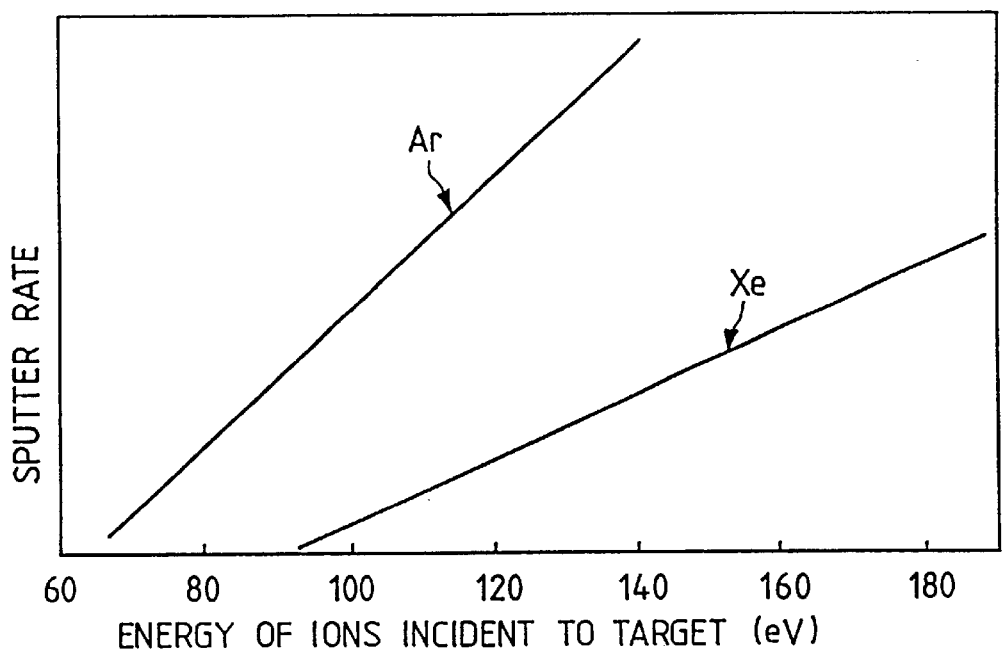
FIG. 9 is a graph to show relations between sputter rate and energy of Ar ions and Xe ions according to the present invention, incident to the Si target.

FIG. 9 shows input energy dependencies of Ar gas and Xe gas with normalized values of sputter rate to the Si target. Even with the same energy value, Ar intrudes deeper into the Si target to effect sputtering, and it is seen that the sputter rate thereof is greater than that of Xe (larger in inclination of its graph).

Next explained is the lens stocker used for the optical article of the present invention.

Generally, water molecules adsorb in some 10 layers on the substrate surface kept in the air (Nakagawa, Izumi, and Obmi "Measurement of amount of adsorbing water on solid surface using HF anhydride" 19th super-ultraclean technology symposium, pp 41, 1993). Therefore, the water molecules would be presumably a big cause to degrade the film quality, for example, as being taken as a pollutant into the film, when the film such as an antireflection film is deposited over the lens surface. It is also reported that activation energy of water molecules adhered to the lens surface, which is a surface mainly containing $SiO_2$, is 0.09 eV, which is obtained from the surface temperature thereof and surface density of molecules adsorbing, and activation energy of the second layer and further layers is 0.12 eV, because bonding is between water molecules (M. Nakamura et al., Extended Abstracts, 180th Electrochemical Society Meeting, Phoenix, Abstract No. 534, pp, 789–799, October 1991). In order to eliminate the water molecules, clean nitrogen with few water molecules is always let to flow in the lens stocker.

Figure 10:
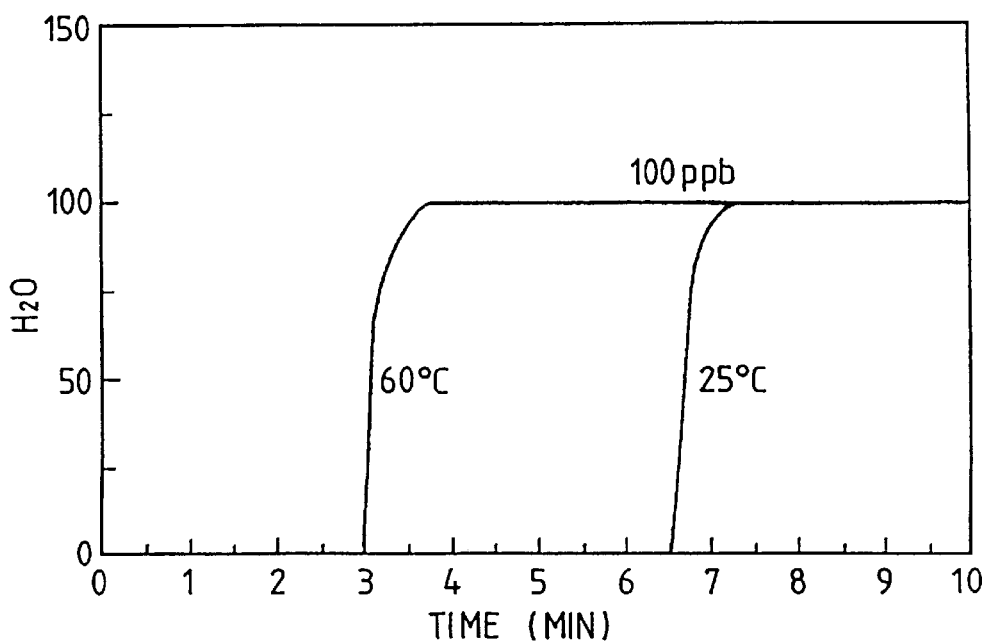
FIG. 10 is a graph to show time changes of water molecule layers on a lens surface according to the present invention.

FIG. 10 shows time changes of water molecule layers on the lens surface in this case. It is seen that water molecules on the surface are being eliminated with a lapse of time. When the lens temperature is kept at about 90° C., the removing rate increases, which is efficient. In the case of the ordinary temperature, the lens is kept in the lens stocker, for example, for a week, clean nitrogen is kept to flow therein, thereafter the lens is introduced into the load-lock chamber, and the chamber is evacuated to a vacuum. Most water molecules on the lens surface can be removed through the above process.

Figure 11:
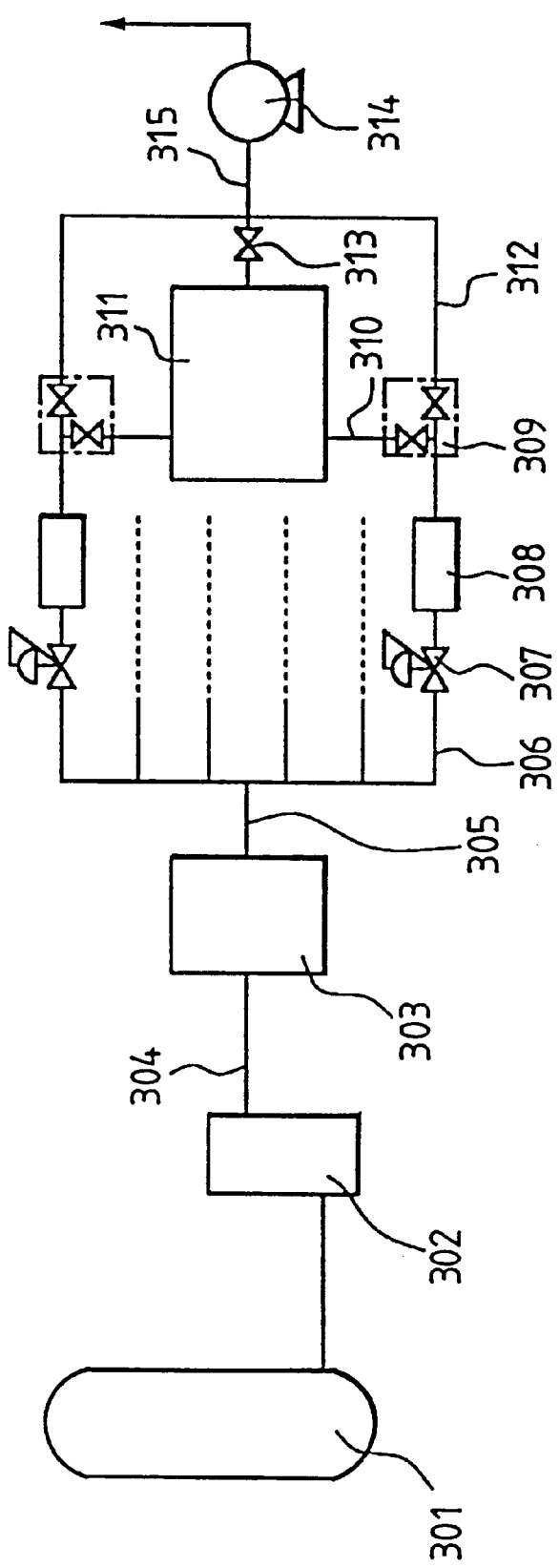
FIG. 11 is a schematic drawing to show a clean nitrogen supply system according to the present invention.

Next explained referring to FIG. 11 is a clean nitrogen supply system for supplying clean nitrogen to the lens stocker. Reference numeral 301 designates a liquid nitrogen gas tank, 302 an evaporator, 303 a purifier, 304 a SUS pipe, 305, 306, 310 SUS pipes passivation-oxidized, 307 a pressure controller, 308 a mass flow controller, 309 a tandem type cross valve for introducing nitrogen gas, 311 the lens stocker, 313 a valve, 314 an exhaust pump, and 315, 312 SUS pipes.

The liquid nitrogen gas is supplied from tank 301 to pass the purifier so that an amount of water may be not more than 0.1 ppb and the number of particles not less than 0.1 $\mu$m may be below the detection limit. The purifier is PEGASUS 200E available from Nippon Sanso, which is a purifier serving as both an adsorption type one and a getter type one. The clean nitrogen gas is introduced through the pressure controller and mass flow controller to the lens stocker, and six inlet portions are provided so as to circulate the gas inside the lens stocker. To remove water on the lens surface, the lens surface may be set near a gas introducing portion so as to blow the gas thereto, but there is no specific limitation on the method. Nitrogen introduced into the lens stocker is exhausted through the valve 313 by the exhaust pump. The exhaust pump is highly effective to replace the ordinary air with nitrogen, but the exhaust pump does not have to be used for evacuation after that; for example, a pushing exhaust or the like may be employed.

(Exposure Apparatus)

Next explained is an exposure apparatus in which the optical article of the present invention is used.

The exposure apparatus may be one of a reduction projection exposure apparatus and a lens type 1:1 projection exposure apparatus using a lens optical system.

Particularly, desired is a stepper employing the step-and-repeat method for performing such an exposure that one small section (field) of a wafer is first exposed, the wafer is then steppped to the next field, and the next field is then exposed, in order to expose the entire wafer. Of course, the optical article of the present invention can also be suitably applicable to the microscan type exposure apparatus.

Figure 4:
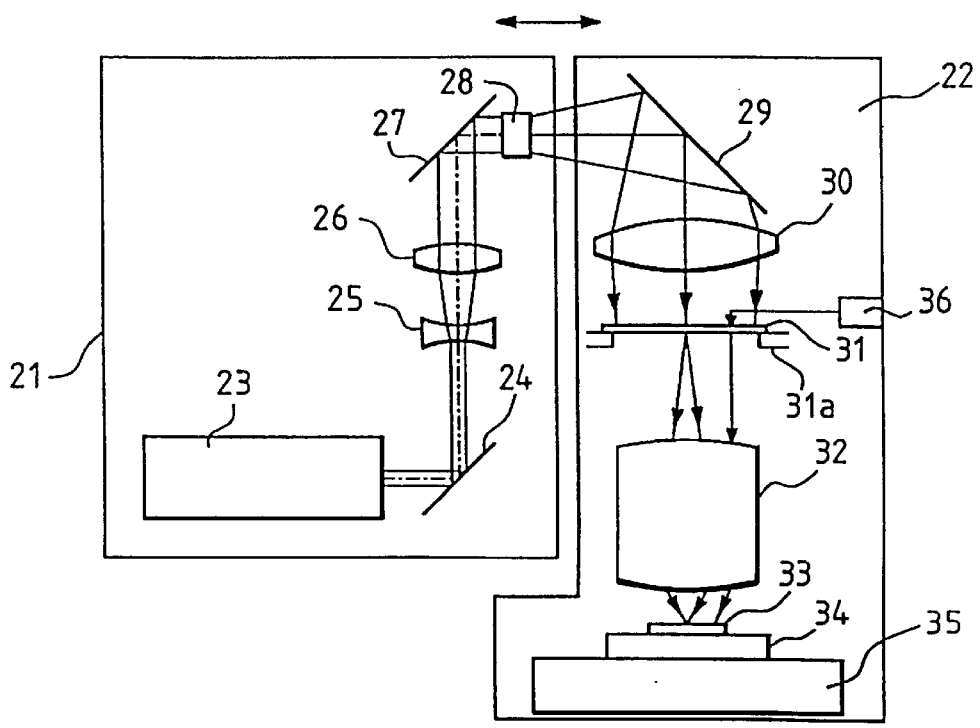
FIG. 4 is a schematic drawing to show a setup of the exposure apparatus of the present invention.

FIG. 4 is schematic structural drawing of the exposure apparatus according to the present invention. In the drawing, numeral 21 designates an illumination light source section and 22 an exsposure mechanism section. The two sections 21, 22 are constructed separately and independently. Namely, they are in a physically separated state. Numeral 23 denotes an illumination light source, which is a large-scale light source of a high output, for example, such as an excimer laser. Numeral 24 represents a mirror, 25 a concave lens, and 26 a convex lens. The lenses 25, 26 have a role as a beam expander, which expands the beam size of a laser to the size of an optical integrator. Numeral 27 stands for a mirror, and 28 for an optical integrator for uniformly illuminating an area on a reticle. The illumination light source section 21 is composed of the elements from the laser 23 to the optical integrator 28. Numeral 29 denotes a mirror, and 30 a condenser lens for collimating beams emerging from the optical integrator 28. Numeral 31 is a reticle on which a circuit pattern is written, 31a is a reticle holder for holding the reticle by suction, 32 is a projection optical system for projecting the pattern on the reticle, and 33 a wafer on which the pattern on the reticle 31 is to be printed through the projection lens 32. Numeral 34 designates an XY stage for holding the wafer 33 by suction and for moving the wafer in the X, Y directions during printing in the step-and-repeat method. Numeral 35 is a base of the exposure apparatus.

The exposure mechanism section 22 is composed of the elements of from the mirror 29, which is a part of the illumination optical system, to the base 35. Numeral 36 is an alignment means used for TTL alignment. Normally, the exposure apparatus further has an autofocusing mechanism, a wafer carrying mechanism, etc., which are also included in the exposure mechanism section 22.

Figure 5:
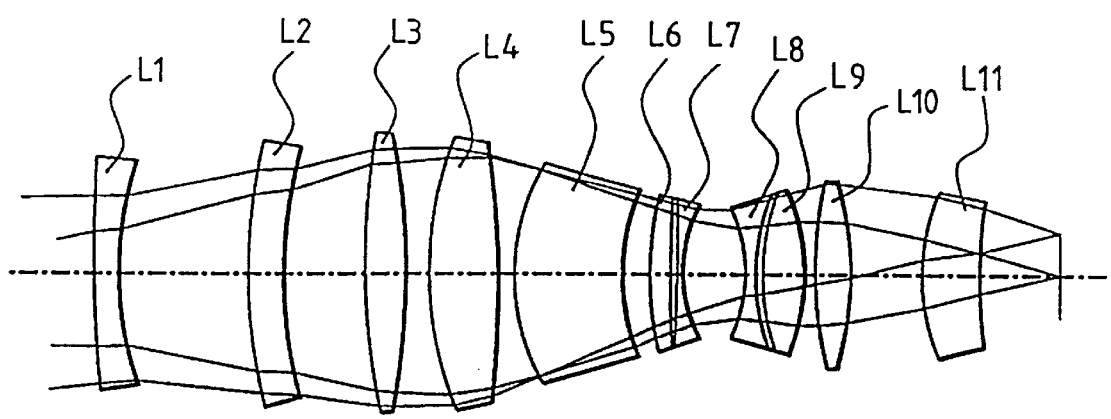
FIG. 5 is a diagrammatic, sectional view to show an example of the optical article used in the exposure apparatus of the present invention.

FIG. 5 shows an example of the optical article used in the exposure apparatus of the present invention, which is a lens assembly used in the projection optical system in the exposure apparatus shown in FIG. 4. This lens assembly is composed of eleven lenses $L_1$ to $L_{11}$ not cemented to each other. The optical thin film of the present invention may be provided as an antireflection film or a reflection-enhanced film on the lenses or the mirrors shown in FIG. 4 and FIG. 5, or on surfaces of mirrors and lenses in a mirror type exposure apparatus, though not shown.

EXAMPLE 1

Specifically explained in the following is a process for forming a thin film of $Ta_2O_5$ on a silica substrate, for example, having a diameter of 120 mm, by the sputtering apparatus shown in FIG. 6. The target was made of tantalum in the size of 5 inches×15 inches and in the thickness of 6 mm. It was a high-purity product with the purity of not less than 0.9999. Pollutants adhering in a very small amount to the substrate surface were first removed by ion irradiation of weak energy (called a surface cleaning step). The introducing gas was Xe of 5 mTorr as an example.

Clean nitrogen was first introduced to the load-lock chamber up to the atmospheric pressure, and then the substrate was carried together with the supporting member thereof from the lens stocker into the load-lock chamber. After the gate valve was closed between the load-lock chamber and the stocker, the inside of the load-lock chamber was evacuated. The vacuum degree reached was $3\times10^{-8}$ Torr. At this stage it is also possible to provide the apparatus with a heating mechanism such as a halogen lamp and to heat the substrate at about 80° C. to 99° C. by the heating mechanism to drive the gas out thereof. Next, the gate valve was opened between the load-lock chamber and the sputter chamber, and the set was carried together with the support member into the sputter chamber to be set in the holder. The Xe gas was introduced into the sputter chamber as rotating the substrate by the rotating mechanism connected to the holder, so that the pressure reached 5 Torr. After being stabilized, high-frequency waves of the frequency 100 MHz and the lower 20 W of RF power were applied to generate plasma, and Xe ion irradiation of weak energy was continued for five minutes to remove pollutants adhered in a very small amount on the lens surface.

At this point the substrate surface was at the floating potential, and the lens surface was irradiated with Xe ions of about 3 eV, which was a potential difference from the plasma potential. This potential difference can be made uniform by using a heavier gas than the Ar gas, which increases uniformity of energy of irradiated ions. Too high an irradiation energy would damage the surface, which would result in failing to form a fine $Ta_2O_5$ film in the subsequent film-forming process. The temperature of the substrate was the ordinary temperature, and a little temperature rise was observed upon ion irradiation. It should be noted that the temperature needs to be controlled so as not to change the microstructure of the lens surface within the range not exceeding 100° C.

After that the $Ta_2O_5$ film was formed by the sputtering process. After the plasma was once stopped by interrupting application of high-frequency waves, the Xe gas and $O_2$ gas were introduce this time into the sputter chamber to achieve the volume ratio $Xe/O_2=10/1$ of the gas flow and the total pressure of 5 mTorr. After being stabilized, the high-frequency waves of the frequency 15 MHz and the power 1 kW of RF power were applied to generate plasma and to carry out film formation. The film-forming rate was 0.5 nm/sec, and the film formation was continued up to the film thickness 250 nm by a quartz oscillation type film thickness gage. A rate of Xe ions impinging on one $Ta_2O_5$ film was 9.2. The energy of Xe ions impinging on the substrate surface at this moment was 8 eV. It was checked by RBS analysis that Xe taken into the $Ta_2O_5$ film at this time was 0.1 atomic %.

Another film not containing Xe was formed in the same manner as the $Ta_2O_5$ film formed under the above conditions except that the Xe gas was replaced by Ar gas. The two films were subjected to irradiation with the i-line of the doubled power for 500 hours, and thereafter transmittance and reflectivity were measured for each of them by spectrophotometry. Then, optical absorption was calculated and expressed by an extinction coefficient.

The extinction coefficient of Ar was 4.5 and that of Xe was 0.1.

Since the purpose of this example was to fabricate the antireflection film against the i-line, the measurement wavelength was 365 nm. It is thus understood that when Xe is used as a sputtering gas rather than Ar, a good-quality film with little optical absorption can be formed as a film with a small extinction coefficient.

Figure 12:
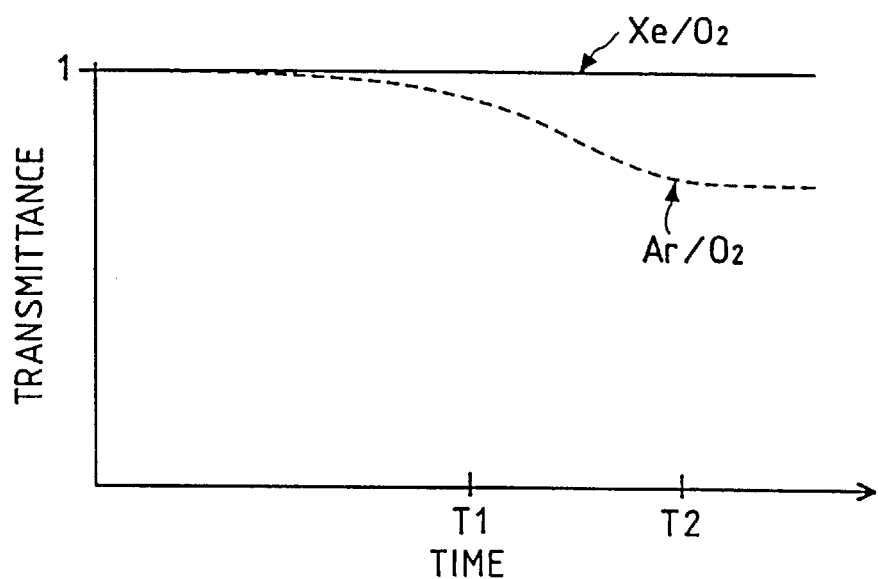
FIG. 12 is a graph to show a change of transmittance with time according to Example 1.

Setting the article thus obtained in the i-line optical system, a time change of transmittance of the lens was measured by irradiating it with the i-line in an irradiation amount two time larger than that used in the ordinary exposure apparatus. The result is shown in FIG. 12. The article having the film obtained by sputtering with Ar not using Xe showed extreme degradation of transmittance after a lapse of a predetermined time T1 of irradiation time, whereas the article of this example showed little degradation of transmittance.

The in-plane distribution of the refractive index was improved by about 10% as compared with the comparative sample obtained using the Ar gas and not using Kr, Xe, or Rn.

EXAMPLE 2

This example is different from Example 1 in that several types of optical thin films of tantalum oxide were made by changing the energy amount of ion irradiation. The other matters were the same as in Example 1.

Figure 13:
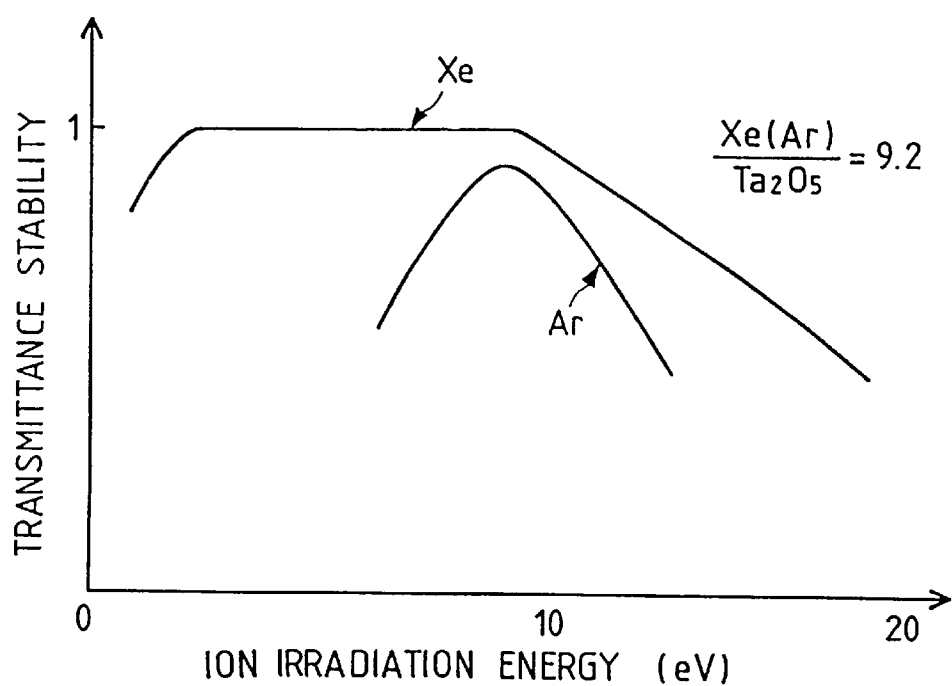
FIG. 13 is a graph to show transmittance stability according to Example 2.

Time changes of transmittances were measured for the optical thin films of this example in the same manner as in FIG. 12 in Example 1. FIG. 13 is a graph to show quantities of degradation of transmittance to an initial value after a lapse of time T2, similarly as in FIG. 12.

It is seen that the range of ion irradiation energy to form a good-quality film with little time change is wider than that of the comparative data of Ar obtained by the same method as the method for producing the film using the Ar gas for comparison in Example 1. This means that use of Xe as a sputtering gas permits a good-quality film to be produced very easily and with good reproducibility.

EXAMPLE 3

This example is different from Example 1 in that several types of optical thin films of tantalum oxide were produced using the following gases instead of the $Xe/O_2$ gas in Example 1.

The gases used in this example were ten types of gases, including a Kr gas of 100 % by volume, a mixture of gases in volume ratios of Kr and Xe being 2:8, 1:1, 8:2, a mixture of gases in volume ratios of Xe and Ar being 2:8, 1:1, and 8:2, and a mixture of gases in volume ratios of Kr and Ar being 2:8, 1:1, and 8:2. The ion irradiation energy was also changed to obtain many samples. The other matters were the same as in Example 1.

Figure 14:
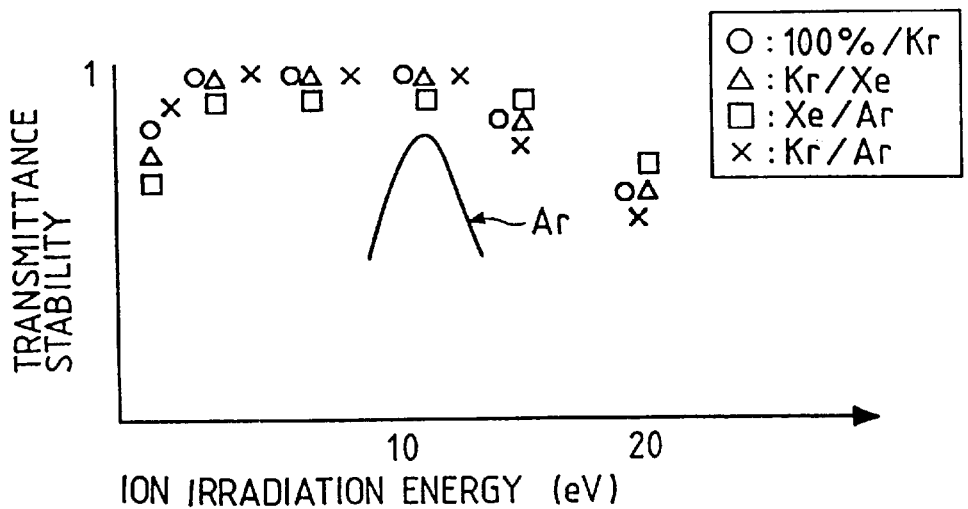
FIG. 14 is a graph to show transmittance stability according to Example 3.

To evaluate the samples, time changes of transmittances were measured in the same manner as in Example 2. FIG. 14 is a graph to show the results. From a comparison with the comparative data of Ar, it is seen that the optical thin films of this example have a wide range of ion irradiation energy to form a good-quality film with little time change. This means that use of Kr or Xe can produce a good-quality film very easily and with good reproducibility.

EXAMPLE 4

This example is different from Example 1 in that several types of optical thin films of tantalum oxide were produced using a mixture of gases in different volume ratios of Xe and $O_2$, and employing the deposition rates between 0.1 nm/sec and 1 nm/sec by controlling the temperature upon film formation with a temperature controller set on the substrate holder in the range of 150° C. to 20° C. and controlling the frequency of power supply in the range of 200 MHz to 10 MHz. The ion irradiation energy was also changed to obtain many samples. The other matters were the same as in 1.

Figure 15:
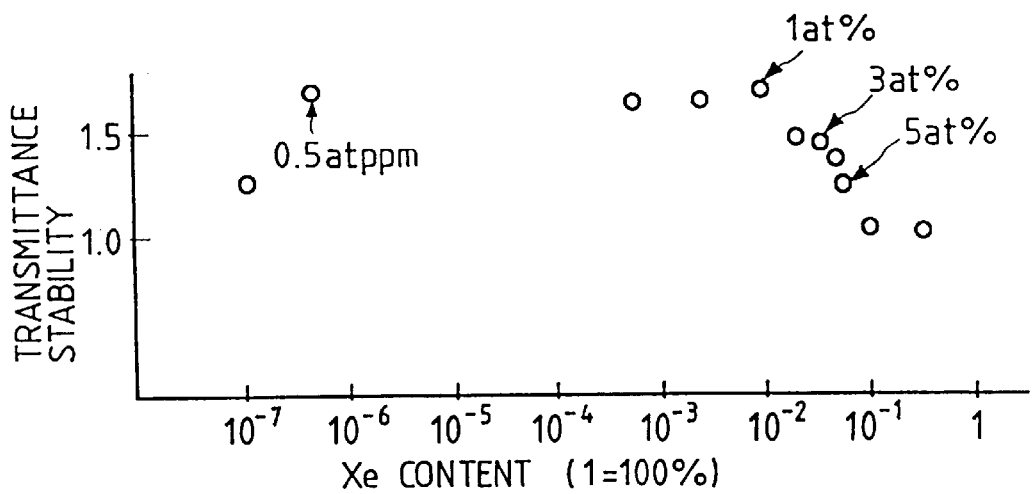
FIG. 15 is a graph to show transmittance stability according to Example 4.

To evaluate the samples, RBS analysis was conducted to measure amounts of Xe contained in the samples. FIG. 15 is a graph to show degrees of time changes of transmittances against a parameter of an amount of Xe. The ordinate of FIG. 15 represents normalized values as setting the case using only Ar gas to 1.0.

As seen from FIG. 15, preferable samples have an amount of Xe dropping in the range of 0.5 atomic ppm to 5 atomic %, more preferable samples have an amount of Xe in the range of 0.5 atomic ppm to 3 atomic %, and most preferable samples have an amount of Xe in the range of 0.5 atomic ppm to 1 atomic %.

EXAMPLE 5

This example is different from Example 4 in that mixture gases in variable volume ratios of Kr and $O_2$ were used instead of the mixture gases in the variable volume ratios of Xe and $O_2$ used in Example 4. The other matters were the same as in Example 4.

SIMS analysis was conducted for the samples in the same manner as in Example 4. Checking degrees of time changes of refractive indices against a parameter of amount of Kr, it was found, similarly as in Example 4, that preferable samples had an amount of Kr in the range of not more than 5 atomic %, more preferable samples had amounts of Kr being 0.5 atomic ppm and 3 atomic %, and the most preferable sample had an amount of Kr being 1 atomic %.

EXAMPLE 6

This example is different from Example 4 in that mixture gases in various volume ratios of Xe, Kr, and $O_2$ were used instead of the mixture gases in various volume ratios of Xe and $O_2$ used in Example 4. The other matters were the same as in Example 4.

RBS analysis was conducted for the samples in the same manner as in Example 4. Checking degrees of time changes of transmittances against a parameter of total content of Kr and Xe, preferable samples had a total amount of not more than 10 atomic %, and most preferable samples had a total amount of not more than 5 atomic %.

EXAMPLE 7

Figure 16:
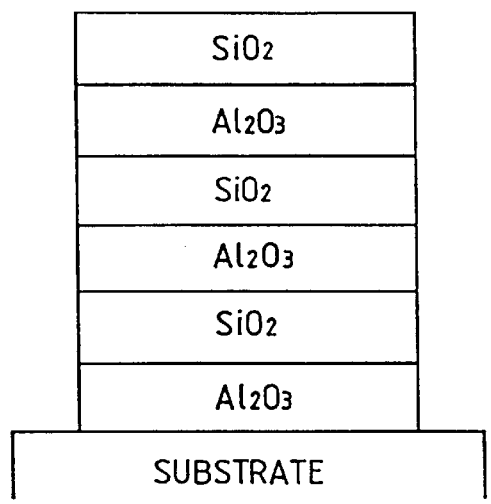
FIG. 16 is a diagrammatic, sectional view to show a layer structure of the optical thin film according to Example 7.

This example is different from Example 1 in that the antireflection film formed on the lens is formed of the first, third, and fifth layers of low index layers mainly containing $SiO_2$ a the second, fourth, and sixth layers of high-index layers mainly containing $Al_1O_3$ in order from the air side to the lens side. Silica glass was used for the substrate and a lens for a KrF excimer laser was produced. FIG. 16 is a diagrammatic, sectional view to show the layer structure of the optical thin film according to this example.

Deposition conditions for bias sputtering are listed below, and the steps up to the surface cleaning step were the same as in Example 1.

After that, discharge was caused against the $Al_2O_3$ target, thereby depositing $Al_2O_3$ containing Xe on the lens. The film-forming conditions at this time were as follows.

RF frequency: 20 MHz

High-frequency power: 1.5 kW $Xe/O_2$ gas=10:1, pressure: 5 mTorr

Growth rate: 0.2 nm/sec

Next, the target holder was rotated to change the target to the $SiO_2$ target, and deposition of $SiO_2$ was carried out. The film-forming conditions at this time were as follows.

RF frequency: 13.56 MHz

High-frequency power: 1.5 kW $Xe/O_2$ gas=5:1, pressure: 5 mTorr

Growth rate: 0.7 nm/sec

Under the above conditions, the antireflection film against ultraviolet light of an excimer laser of 24 nm was formed with the refractive indices and optical film thicknesses as listed in Table 1 below. The refractive indices in the table were those to ultraviolet light of 248 nm.

TABLE 1

|  | Material | Index | Optical Thickness |
| --- | --- | --- | --- |
| Entrance Medium | Air | 1.000 |  |
| 1st layer | $SiO_2$ | 1.488 | 62.308 |
| 2nd layer | $Al_2O_3$ | 1.684 | 60.575 |
| 3rd layer | $SiO_2$ | 1.488 | 56.110 |
| 4th layer | $Al_2O_3$ | 1.684 | 63.882 |
| 5th layer | $SiO_2$ | 1.488 | 97.598 |
| 6th layer | $Al_2O_3$ | 1.684 | 101.324 |
| Exit medium | synthetic silica | 1.509 |  |

Figure 17:
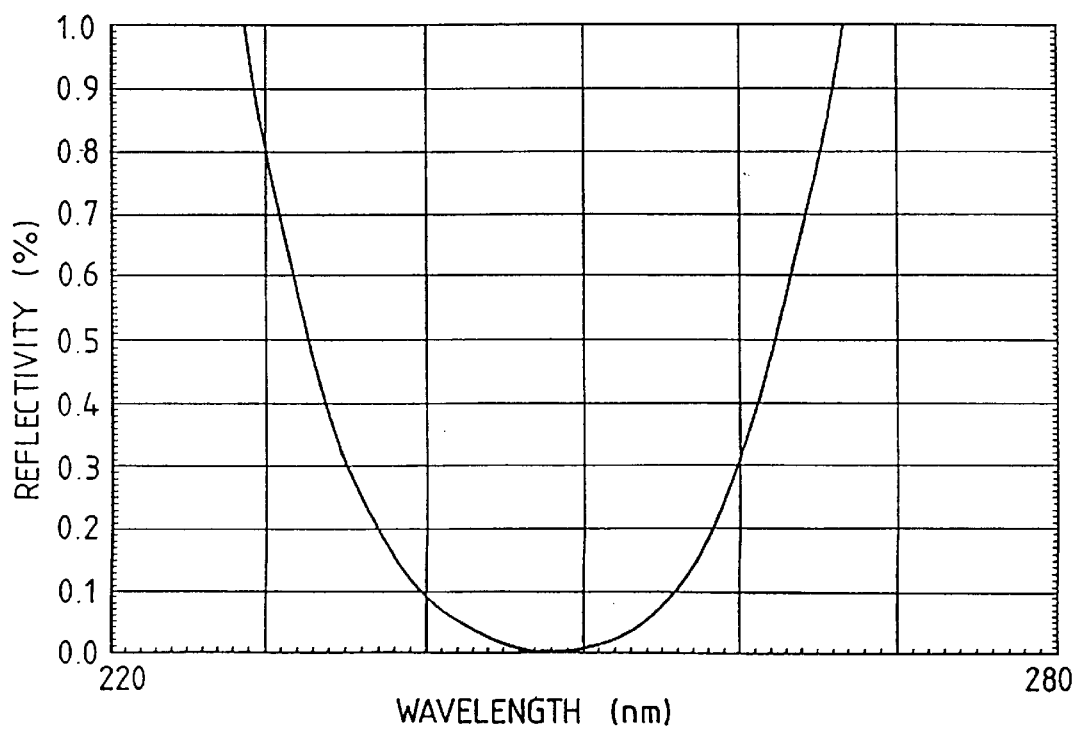
FIG. 17 is a graph to show reflection characteristics of the optical thin film according to Example 7.
Figure 18:
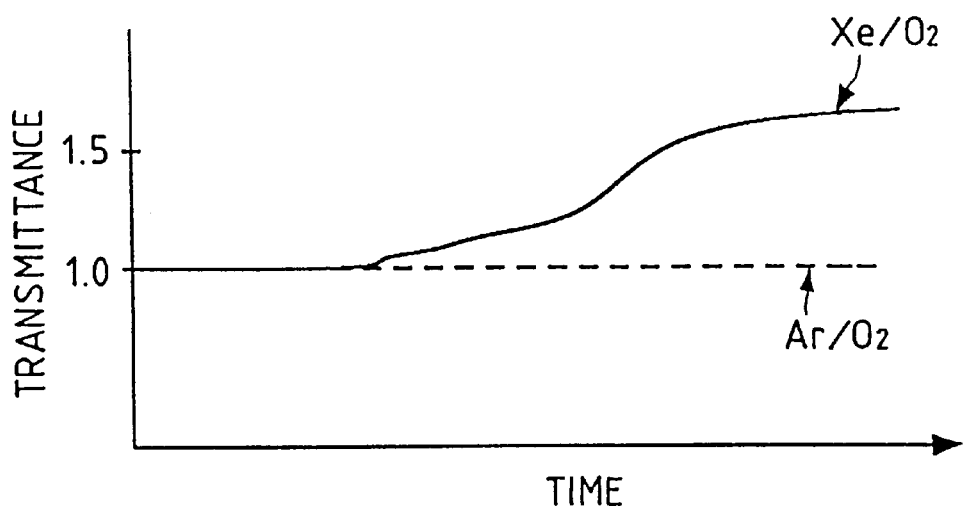
FIG. 18 is a graph to show a time change of transmittance of the optical thin film according to Example 7.

FIG. 17 is a graph to show reflection characteristics of this film. FIG. 18 is a graph to show a time change of transmittance of the film as normalized with respect to a film formed in the same manner using Ar instead of the part of the above Xe gas, as defined to 1.0. It is clearly seen from FIG. 18 that the film using the Xe gas has a longer life.

The above evaluation was obtained by an accelerated durability test for an optical system shown in FIG. 5, using the lens produced in this example, in which the excimer laser light was applied for 1000 hours in a light quantity two times greater than the irradiation light quantity used in the normal excimer laser stepper.

EXAMPLE 8

Figure 19:
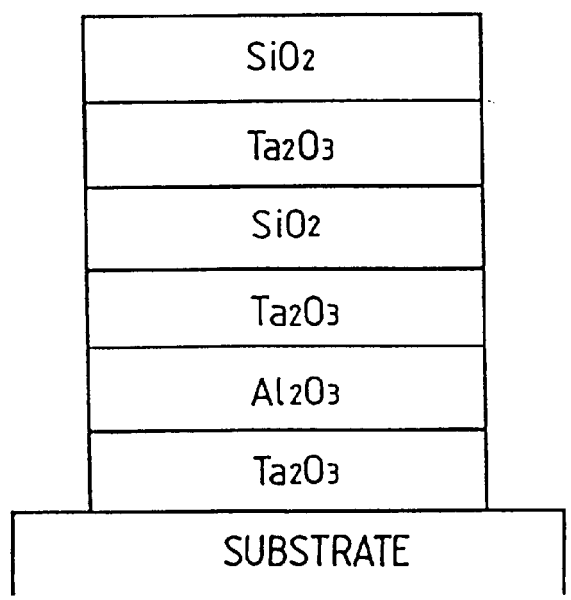
FIG. 19 is a diagrammatic, sectional view to show a layer structure of the optical thin film according to Example 8.

This example is different from Example 1 in that the antireflection film formed on the lens is composed of the first and third layers of low-index layers mainly containing $SiO_2$, the second, fourth, and sixth layers of high-index layers mainly containing $Ta_2O_5$, and the fifth layer of a layer containing $Al_2O_3$ in order from the air side to the lens side. The substrate was a lens made of silica glass. FIG. 19 is a diagrammatic, sectional view to show the layer structure of the optical thin film according to this example.

The deposition conditions for bias sputtering are listed below, and the steps up to the surface cleaning step were the same as in Example 1.

After that, discharge was caused against the $Ta_2O_5$ target, then depositing $Ta_2O_5$ containing Xe and Kr on the lens. The film-forming conditions at this time were as follows.

RF frequency: 100 MHz

High-frequency power: 2 kW

Xe/Kr/$O_2$ gas=5:5:1, pressure: 5 mTorr

Growth rate: 0.2 nm/sec

Next, the target holder was rotated to change the target to the $SiO_2$ target, and deposition of $SiO_2$ was carried out. The film-forming conditions at this time were as follows.

RF frequency: 100 MHz

High-frequency power: 2 kW

Xe/Kr/$O_2$ gas=5:5:1, pressure: 5 mTorr

Growth rate: 0.4 nm/sec

In film formation of $Al_2O_3$, the target holder was rotated in the same manner to change the target to the $Al_2O_3$ target, and deposition of $Al_2O_3$ film containing Xe and Kr was carried out. The film-forming conditions at this time were as follows.

RF frequency: 100 MHz

High-frequency power: 2 kW

Xe/Kr/$O_2$ gas=5:5:1, pressure: 5 mTorr

Growth rate: 0.1 nm/sec

Under the above conditions, the antireflection film was formed against both ultraviolet light of the center wavelength 365 nm and visible light of center wavelengths 550 to 650 nm so as to have the refractive indices and optical film thicknesses as listed in Table 2 below. The refractive indices in the table are those to the light of 365 nm.

TABLE 2

|  | Material | Index | Optical Thickness |
| --- | --- | --- | --- |
| Entrance Medium | Air | 1.000 |  |
| 1st layer | $SiO_2$ | 1.449 | 105.609 |
| 2nd layer | $Ta_2O_5$ | 2.171 | 72.609 |
| 3rd layer | $SiO_2$ | 1.449 | 13.990 |
| 4th layer | $Ta_2O_5$ | 2.171 | 140.874 |
| 5th layer | $Al_2O_3$ | 1.614 | 28.952 |
| 6th layer | $Ta_2O_5$ | 2.171 | 32.130 |
| Exit medium | F8 | 1.633 |  |

Figure 20:
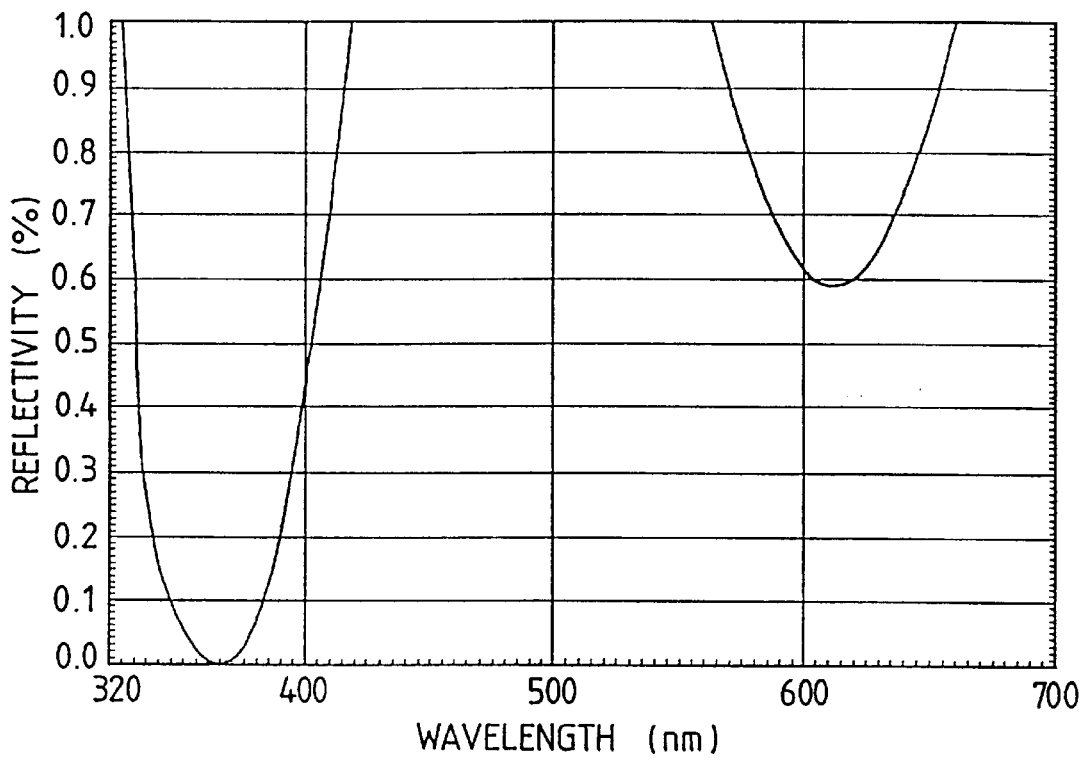
FIG. 20 is a graph to show reflection characteristics of the optical thin film according to Example 8.
Figure 21:
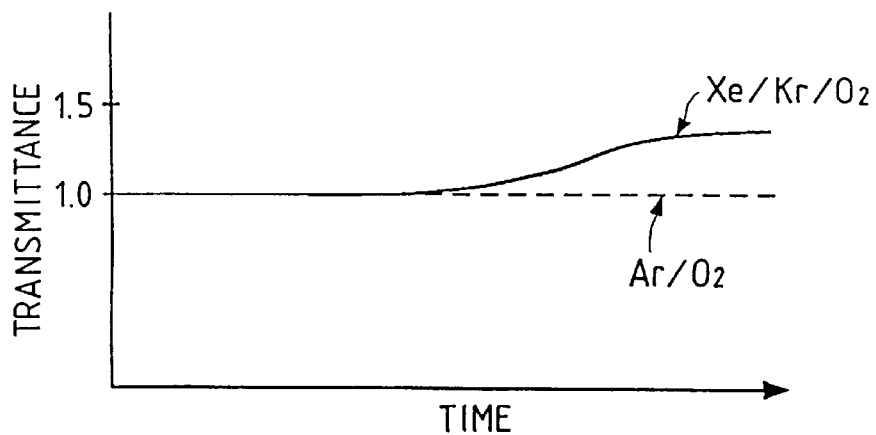
FIG. 21 is a graph to show a time change of transmittance of the optical thin film according to Example 8.

FIG. 20 is a drawing to show reflection characteristics of this film. FIG. 21 is a graph to show a time change of transmittance of the film as normalized with respect to a film obtained by changing the part of the above Xe gas and Kr gas to Ar, as defined to 1.0. It is clearly seen from FIG. 21 that the film using the Xe and Kr mixture gas has a longer life.

The above evaluation was obtained by the same test as in Example 7 by forming the optical system of FIG. 5 using the lens of this example and using the i-line light source for emitting the ultraviolet light of 365 nm instead of the excimer laser.

EXAMPLE 9

This example is different from Example 1 in that a reflection-enhanced film formed on the lens is composed of the first, third, . . . , 49th layers of high-index layers mainly containing $Ta_2O_5$ and the second, fourth, sixth, . . . , 50th of low-index layers mainly containing $SiO_2$ in order from the air side to the lens side. A lens made of silica glass was used as a substrate.

The deposition conditions for bias sputtering are listed below, and the steps up to the surface cleaning step were the same as in Example 1.

After that, discharge was caused against the $Ta_2O_5$ target, and deposition of $Ta_2O_5$ was carried out on the silica glass. The film-forming conditions at this time were as follows.

RF frequency: 100 MHz

High-frequency power: 2 kW

Xe/Kr/Ar/$O_2$ gas=5:5:1:1, pressure: 5 mTorr

Growth rate: 0.3 nm/sec

Next, the target holder was rotated to change the target to the $SiO_2$ target, and deposition of the $SiO_2$ film was carried out. The film-forming conditions at this time were as follows.

RF frequency: 100 MHz

High-frequency power: 2 kW

Xe/Kr/Ar/$O_2$ gas=5:5:1:1, pressure: 5 mTorr

Growth rate: 0.5 nm/sec

Under the above conditions, the reflection-enhanced film was formed to the near-ultraviolet light of the center wavelength 365 nm.

Figure 22:
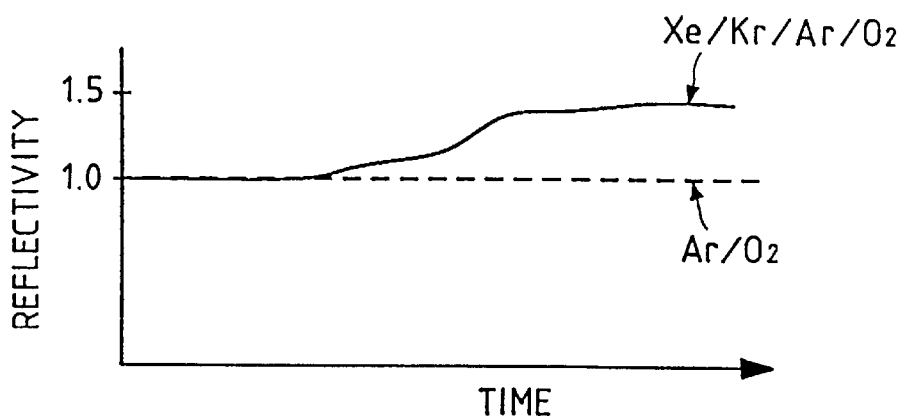
FIG. 22 is a graph to show a time change of reflectivity of the optical thin film according to Example 9.

FIG. 22 is a graph to show a time change of reflectivity of the film with respect to a film formed in the same manner except that the portion of the above Xe gas and Kr gas was changed to Ar. It is clearly seen from FIG. 22 that the film using the Xe, Kr gases has a longer life.

The above test was conducted for the optical system shown in FIG. 4 assembled using the lens produced in this example.

EXAMPLE 10

In this example, several types of optical thin films of aluminum oxide were produced by using mixture gases in various volume ratios of Xe and $O_2$ and setting the deposition rate to 0.1 nm/sec to 1 nm/sec by controlling the temperature upon film formation with a temperature controller mounted to the substrate holder in the range of 150° C. to 20° C. and controlling the frequency of power supply in the range of 200 MHz to 10 MHz. The other matters were the same as in Example 4.

Figure 23:
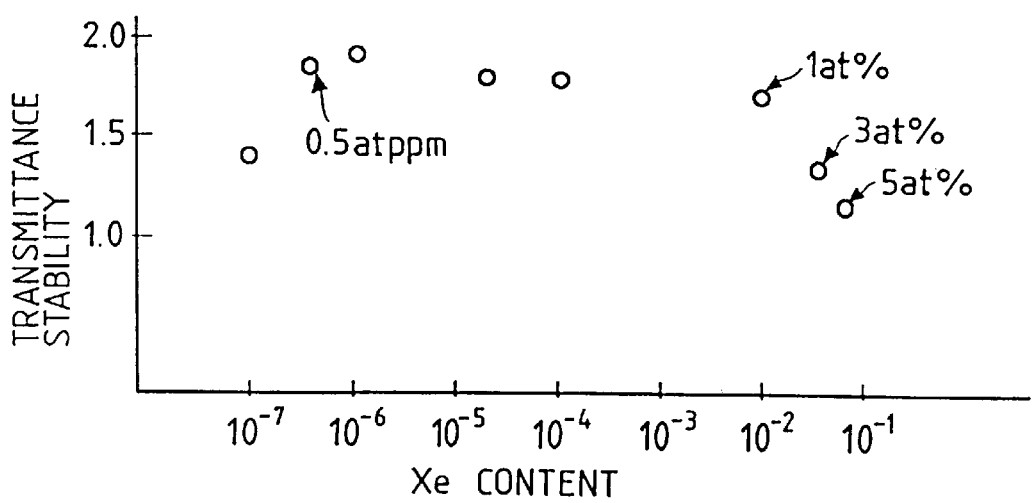
FIG. 23 is a graph to show transmittance stability according to Example 10.

FIG. 23 is a graph to show transmittance stability against amount of Xe.

Figure 24:
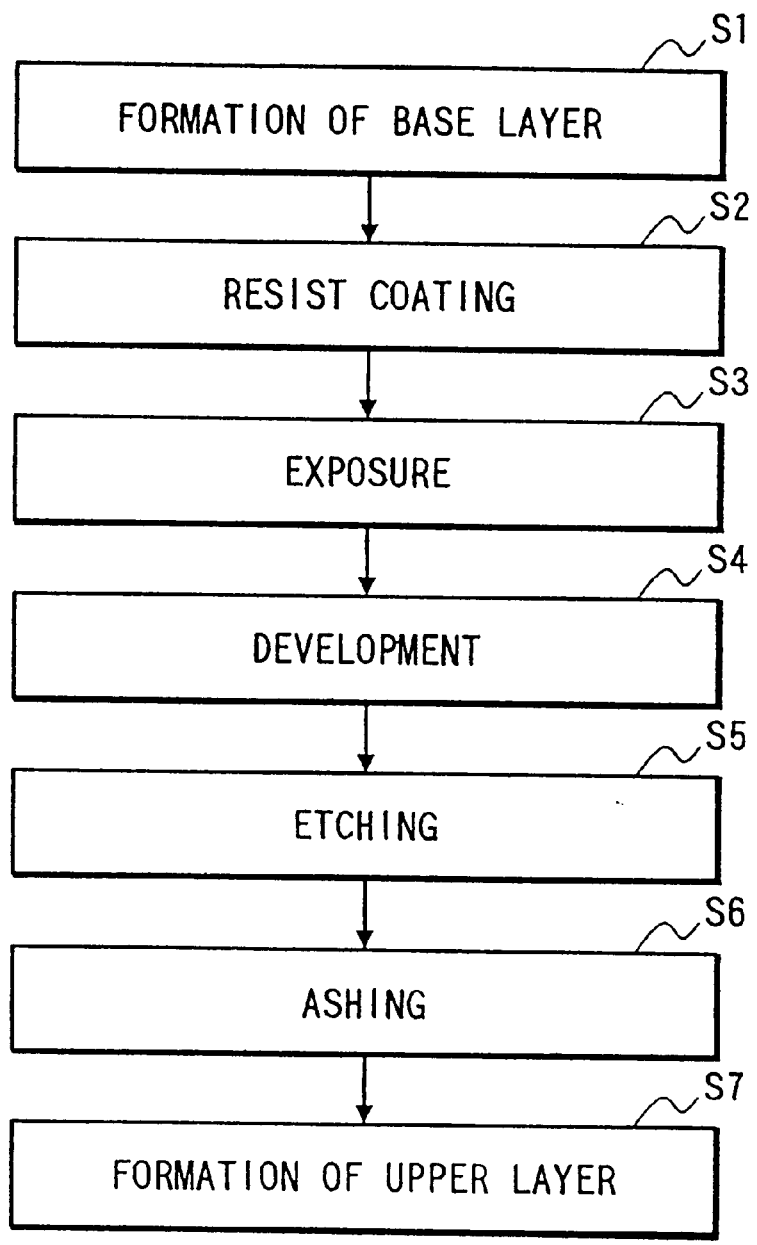
FIG. 24 is a flowchart to show fabrication steps of IC, using the exposure apparatus of the present invention.

Using the exposure apparatus with an illumination system including the optical article as explained above, a pattern can be formed by photolithography in the minimum line width of not more than 1 μm (in the submicron order), as shown in FIG. 24.

At step S1 a base coating film, such as silicon oxide, silicon nitride, polycrystal silicon, aluminum, tungsten, titanium nitride, or the like, is formed on the substrate.

At step S2 the resultant is coated with a negative resist or a positive resist of a photosensitive resin.

At step S3 the resist is exposed through an exposure mask (reticle) using the KrF excimer laser, thereby forming a latent image of the pattern in the resist.

At step S4 the resist is developed with a developer to leave exposed portions or non-exposed portions. The left portions become a resist pattern.

At step S5 the base layer is etched with the resist pattern as an etching mask, thereby forming a coating pattern corresponding to the etching mask. If the coating layer is polycrystal silicon, the line width can be formed below 1 $\mu$m. Thus, transistors can be formed with the gate length of the submicron order.

At step S6 ashing is carried out to remove the resist.

According to the present invention, even if many semiconductor integrated circuits (ICs) are fabricated by repeating the above steps, the resist patterns corresponding to the exposure mask pattern can be obtained with good reproducibility, because there is no deterioration of the antireflection film of the lens. The yield of ICs can be improved accordingly.

What is claimed is:

1. A process for producing an optical article, said process comprising:

laminating a first optically transparent thin layer and a second optically transparent thin layer having a higher refractive index than that of the first optically transparent thin layer on a surface of a substrate, wherein at least one of the first and second optically transparent thin layers is deposited by sputterin using a sputtering gas comprising atoms of at least one selected from the group consisting of krypton, xenon, and radon.

2. The process for producing the optical article according to claim 1, further comprising using a gas for oxidation as a reaction gas in addition to the sputtering gas.

3. The process for producing the optical article according to claim 1, further comprising holding the substrate at 100° C. or less in said sputtering.

4. The process for producing the optical article according to claim 1, wherein, before said sputtering, at least a film-forming surface of the substrate is held at 100° C. or less under a nitrogen gas atmosphere.

5. A process for producing an optical article having a film, said process comprising:

performing a sputtering step for forming the film on a substrate using a sputtering gas containing atoms of at least one selected from the group consisting of krypton, xenon and radon, wherein the film comprises atoms of at least one selected from the group consisting of krypton, xenon, and radon in which the content of the atoms is within a range of from 0.5 atomic ppm to 1 atomic %, inclusive.

6. The process according to claim 5, wherein the substrate comprises fluorite.

7. The process according to claim 5, further comprising using a gas for oxidation as a reactive gas in addition to the sputtering gas.

8. The process according to claim 5, further comprising holding the substrate at a temperature of at most 100° C. in said sputtering step.

9. The process according to claim 5, further comprising holding at least a film-forming surface of the substrate at a temperature of at most 100° C., under a nitrogen gas atmosphere, before performing said sputtering step.

10. The process according to claim 5, wherein the optical article is a transparent optical article.

11. The process according to claim 5, wherein the optical article is a mirror.

12. The process according to claim 5, wherein the optical article selectively transmits excimer laser light.

13. The process according to claim 5, wherein the optical article selectively reflects excimer laser light.

14. The process according to claim 5, wherein, on the substrate surface, the optical article is provided with a plurality of optical thin films comprising a first optically transparent thin layer and a second optically transparent thin layer having a higher refractive index than that of the first optically transparent thin layer, and at least one of the first and second optically transparent thin layers contains atoms of at least one selected from the group consisting of krypton, xenon and radon in which the content of the atoms is within a range of 0.5 atomic ppm to 1 atomic %, inclusive.

15. The process according to claim 14, wherein plurality of optical films constitute antireflection films.

16. The process according to claim 14, wherein the plurality of optical films constitute reflection-enhanced films.

17. The process according to claim 14, wherein the optical article further comprises a third optically transparent thin layer having a refractive index different from those of the first and second optically transparent thin layers.

18. The process according to claim 14, wherein the first optically transparent thin layer comprises silicon oxide.

19. The process according to claim 14, wherein the second optically transparent thin layer comprises aluminum oxide.

20. The process according to claim 14, wherein the second optically transparent thin layer comprises tantalum oxide.

21. The process according to claim 14, wherein contents of the atoms in the first and second optically transparent thin layers are different from each other.

22. A process for producing an optical article having a film, said process comprising:

performing a sputtering step for forming the film on a substrate using a sputtering gas containing atoms of at least one selected from the group consisting of krypton, xenon, and radon, wherein the substrate comprises fluorite.

23. The process according to claim 22, further comprising using a gas for oxidation as a reactive gas in addition to the sputtering gas.

24. The process according to claim 22, further comprising holding at least a film-forming surface of the substrate at a temperature of at most 100° C., in said sputtering step.

25. The process according to claim 22, further comprising holding at least a film-forming surface of the substrate at a temperature of at most 100° C., under a nitrogen gas atmosphere, prior to performing said sputtering step.

26. The process according to claim 22, wherein the optical article is a transparent optical article.

27. The process according to claim 22, wherein the optical article is a mirror.

28. The process according to claim 22, wherein the optical article selectively transmits excimer laser light.

29. The process according to claim 22, wherein the optical article selectively reflects excimer laser light.

30. The process according to claim 22, wherein, on the substrate surface, the optical article is provided with a plurality of optical thin films comprising a first optically transparent thin layer and a second optically transparent thin layer having a higher refractive index than that of the first optically transparent thin layer, and at least one of the first and second optically transparent thin layers contains atoms of at least one selected from the group consisting of krypton, xenon, and radon.

31. The process according to claim 30, wherein the plurality of optical films constitute antireflection films.

32. The process according to claim 30, wherein the plurality of optical films constitute reflection-enhanced films.

33. The process according to claim 30, wherein the optical article further comprises a third optically transparent thin layer having a refractive index different from those of the first and second optically transparent thin layers.

34. The process according to claim 30, wherein the first optically transparent thin layer comprises silicon oxide.

35. The process according to claim 30, wherein the second optically transparent thin layer comprises aluminum oxide.

36. The process according to claim 30, wherein the second optically transparent thin layer comprises tantalum oxide.

37. The process according to claim 30, wherein contents of the atoms in the first and second optically transparent thin layers are different from each other.

* * * * *

UNITED STATES PATENT AND TRADEMARK OFFICE
CERTIFICATE OF CORRECTION

PATENT NO.    : 6,726,814 B2          Page 1 of 1
DATED         : April 27, 2004
INVENTOR(S)   : Tadahiro Ohmi et al.

It is certified that error appears in the above-identified patent and that said Letters Patent is hereby corrected as shown below:

Title page,
Insert Item -- [73] Assignee:     Canon Kabushiki Kaisha, Tokyo (JP) --.
Insert Item -- [74] *Attorney, Agent, or Firm* - Fitzpatrick, Cella, Harper & Scinto --.

Column 6,
Line 15, "substrate un" should read -- substrate 1 in --.

Column 8,
Line 18, "in" should read -- an --.

Column 9,
Line 11, "From" should read -- For --.
Line 18, "had better" should read -- should --.

Column 10,
Line 1, "stockers" should read -- stocker --.
Line 30, "Which" should read -- which --.
Line 44, "an" should read -- the --.

Column 11,
Line 67, "let" should read -- allowed --.

Column 12,
Line 55, "exsposure" should read -- exposure --.

Column 13,
Line 12, "of from" should read -- from --.

Signed and Sealed this

Fourteenth Day of December, 2004

JON W. DUDAS
*Director of the United States Patent and Trademark Office*